(12) United States Patent
Bacchi et al.

(10) Patent No.: US 6,281,516 B1
(45) Date of Patent: Aug. 28, 2001

(54) FIMS TRANSPORT BOX LOAD INTERFACE

(75) Inventors: Paul Bacchi, Novato; Paul S. Filipski, Greenbrae, both of CA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 09/352,155

(22) Filed: Jul. 12, 1999

Related U.S. Application Data

(60) Provisional application No. 60/092,626, filed on Jul. 13, 1998.

(51) Int. Cl.[7] .................................................... G01N 21/86
(52) U.S. Cl. ...................................... 250/559.29; 206/408
(58) Field of Search ............................ 250/559.29, 559.3, 250/221, 239; 206/387.1, 387.11, 387.12, 387.14, 309, 397, 408; 414/936–939, 405–408

(56) References Cited

U.S. PATENT DOCUMENTS

| | | | |
|---|---|---|---|
| 4,762,228 | * 8/1988 | McConnell, III et al. | 206/387 |
| 5,773,386 | 6/1998 | Mages et al. | 414/411 |

* cited by examiner

Primary Examiner—Que T. Le

(74) Attorney, Agent, or Firm—Stoel Rives LLP

(57) ABSTRACT

A box load interface implemented in a FIMS system includes a retractable port door that is attachable to the box door of a transport box. The port door selectively moves the box door toward or away from the box cover of the transport box to thereby open or close it. A slidable tray is mounted to a support shelf that receives the transport box which is clamped to the slidable tray while it is moved by a positioning mechanism to force the box cover against the port plate. The positioning mechanism also disengages the clamping mechanism to release the box cover as it retracts from the port plate. A port door translation mechanism is operatively connected to the port door to advance it and retract it toward and away from a port plate aperture. A port door elevator assembly operates in cooperation with the port door translation mechanism to move the port door after the box door has been moved away from the box cover and through the port plate aperture. A differential optical scanning assembly detects positions of wafer specimens located in the transport box. A robot assembly is supported by a linear traveling assembly between adjacent port plate apertures for removing and inserting wafer specimens from the transport box. The linear traveling assembly includes a carriage that supports the robot assembly and that travels along a lead screw between the port plate apertures driven by a lead nut mechanism.

17 Claims, 21 Drawing Sheets

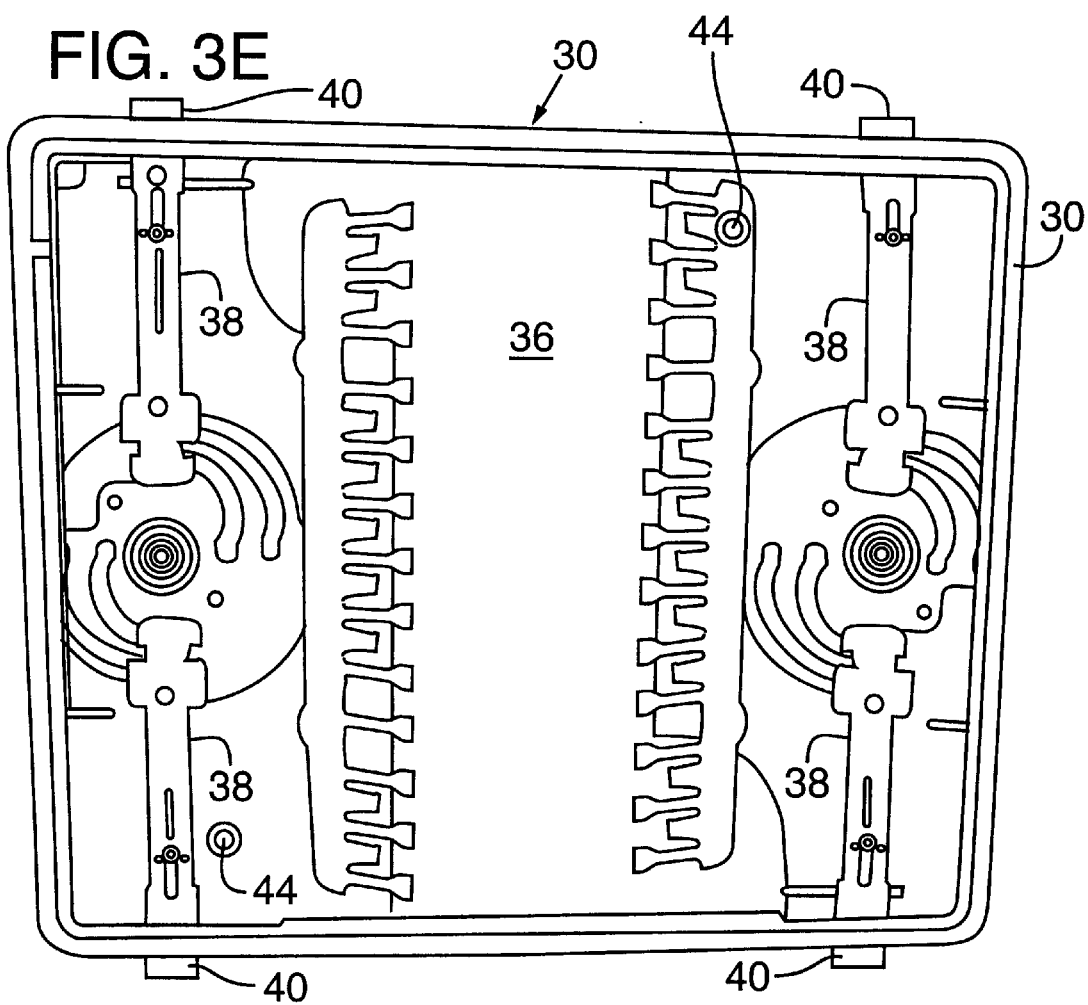

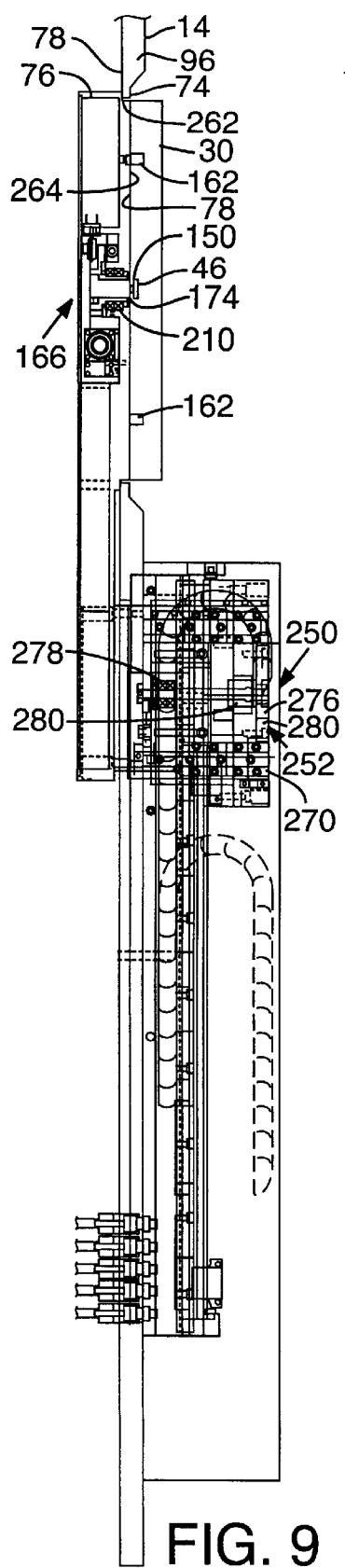

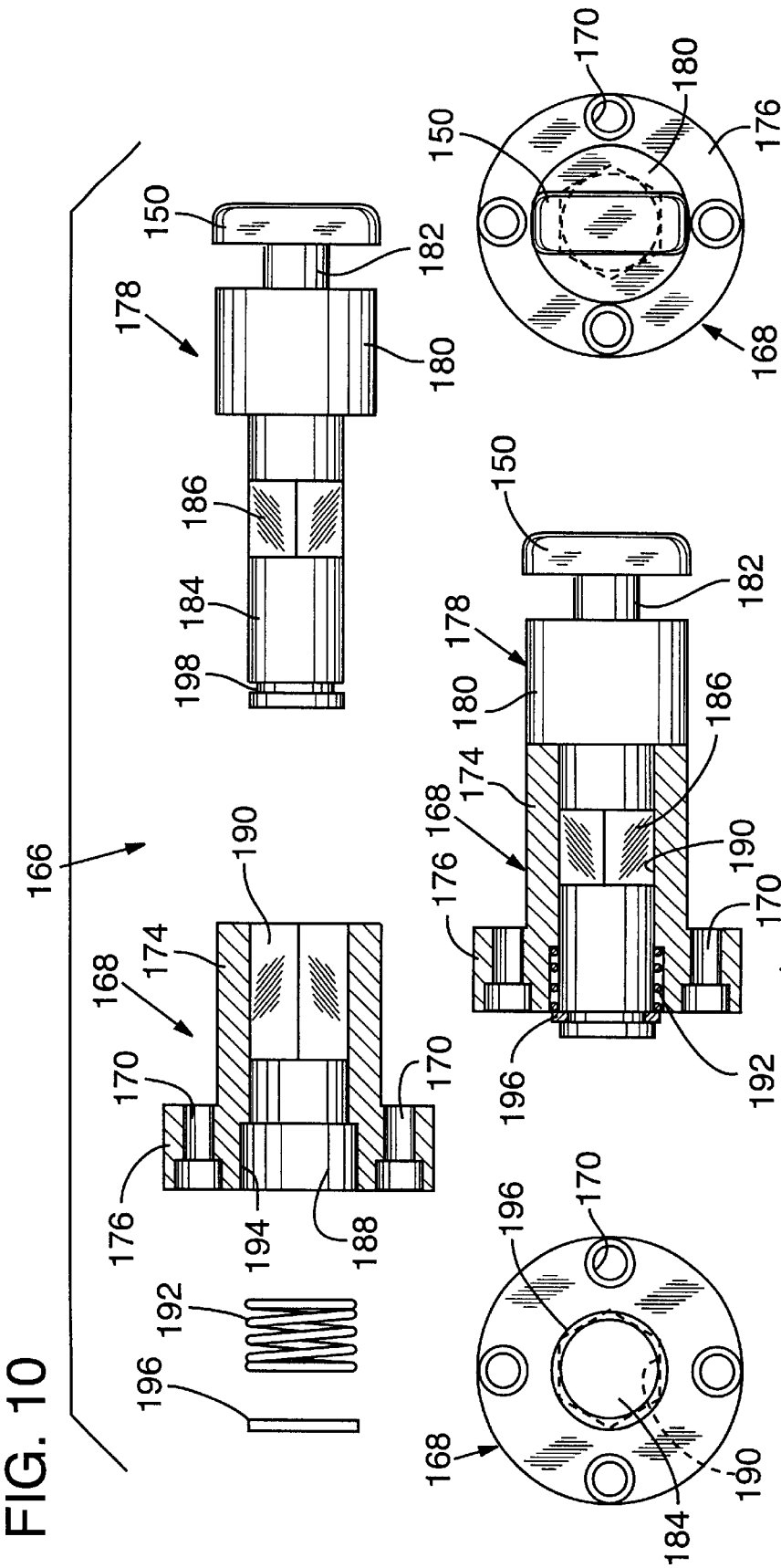

FIMS TRANSPORT BOX LOAD INTERFACE

This application claims the benefit of provisional application Ser. No. 60/092,626, filed Jul. 13, 1998.

TECHNICAL FIELD

The present invention relates to front-opening interface mechanical standard (FIMS) system equipment and, in particular, to a FIMS transport box load interface that facilitates proper registration and accurate, secure positioning of a transport box as the specimens it contains are transferred between a minienvironment and a separate, enclosed specimen transport system.

BACKGROUND OF THE INVENTION

A system designed to incorporate FIMS permits handling of semiconductor wafers inside and outside of clean room facilities by interfacing a clean semiconductor wafer cassette transport box or pod to a clean environmental housing for semiconductor processing equipment or to other clean environments. The system concept entails mating a box door on a front-opening cassette container box to a port door on an equipment enclosure and transferring the cassette into and out of the processing equipment without exposing to outside contamination the semiconductor wafers carried by the cassette.

A standard interface is required for cassette transport boxes intended to control the transport environment of cassettes containing semiconductor wafers. The standard interface addresses the proper transport box orientation for material transfer and maintains continuity between the transport box and semiconductor processing equipment environment to control particulate matter. The FIMS specifications are set out in the Semiconductor Equipment and Materials International (SEMI) standard SEMI E47-, E57-, E62-, and E63-0298 (1996-1998).

A FIMS system includes minimum volume, sealed front-opening boxes used for storing and transporting semiconductor wafer cassettes and canopies placed over wafer processing areas of semiconductor processing equipment so that the environments inside the boxes and canopies in cooperation with clean air sources become miniature clean spaces. The boxes are made of plastic materials having registration features located relative to one another within and of sizes characterized by relatively wide tolerances that can affect equipment alignment precision. What is needed is a box load interface implemented as part of a transfer mechanism for precise box alignment during loading and unloading wafer cassettes from a sealed box without external environment contamination of the wafers carried by the wafer cassette.

SUMMARY OF THE INVENTION

The present invention is a box load interface implemented in a FIMS system. The box load interface comprises a retractable port door that is attachable to the box door of a transport box and that selectively moves the box door toward or away from the box cover of the transport box to thereby open or close it. A port plate has a front surface and a port plate aperture through which the box door can move as the port door moves the box door toward or away from the box cover. A slidable tray slidably mounted to a support shelf positioned transversely of the port plate receives the transport box in a predetermined orientation established by kinematic coupling surfaces located on the top surface of the slidable tray.

A box hold down clamping mechanism is mounted to the support shelf. A slidable tray positioning mechanism selectively moves the slidable tray on the support shelf and thereby moves the transport box toward or away from the port plate. The positioning mechanism is operatively connected to the clamping mechanism to engage the clamping mechanism to a front clamping feature positioned on the bottom surface of the transport box and thereby apply an urging force to the box cover against the kinematic coupling surfaces while the slidable tray advances toward the port plate to push the front opening of the box cover against the front surface of the port plate. The positioning mechanism is operatively connected to the clamping mechanism also to disengage the clamping mechanism from the front clamping feature and thereby release the urging force from the box cover against the kinematic coupling surfaces while the slidable tray retracts from the port plate to pull the box cover away from the front surface of the port plate.

The box hold down clamping mechanism preferably includes a pivot finger pivotally mounted to the support shelf, and the slidable tray includes a push pin. The pivot finger has a recessed area that forms first and second angularly offset push pin contact surfaces that receive the push pin as the slidable tray moves the transport box toward the port plate and thereby rotates the pivot finger in a first rotational sense to engage the pivot finger to the front feature and moves the transport box away from the port plate and thereby rotates the pivot finger in a second rotational sense that is opposite to the first rotational sense to disengage the pivot finger from the front feature. The pivot finger includes a roller bearing that engages the front feature as the pivot finger rotates in the first rotational sense.

The port plate includes a surface from which two compliant latch keys extend to mate with and operate the latch actuating coupler mechanism within its relatively wide alignment tolerance range, and a latching motor mechanism operatively connected to the compliant latch keys selectively rotates them between first and second angular positions. The latch keys are designed to "wobble" laterally to accommodate the tolerance range of the corresponding mating features on the box door and thereby ensure proper alignment to it. The first angular position secures the port door to and the second angular position releases the port door from the box door when the port and box doors are in matable connection.

The box load interface system also comprises a port door translation mechanism that is operatively connected to the port door to advance it in a forward direction toward the port plate aperture to attach the port door to the box door and then retract it and the attached box door in reverse direction away from the box cover and through the port plate aperture. A port door elevator assembly operates in cooperation with the port door translation mechanism to move the port door in a direction generally parallel to the front surface of the port plate after the box door has been moved away from the box cover and through the port plate aperture.

The transport box holds a container in which multiple wafer specimens are stored in spaced-apart, stacked arrangement. The container has an open front side from which the specimens are removed or into which the specimens are inserted. The box load interface comprises a differential optical scanning assembly for detecting positions of the wafer specimens. The scanning assembly scans the wafer specimens in a direction parallel to a facial datum plane, which is defined as a vertical plane that bisects the wafer specimens and is parallel to the open front side where the wafer specimens are removed or inserted. Scanning assembly includes two spaced-apart, pivotally mounted scanner fingers that are operable to center and push back dislodged specimens before determining their orientations in the cassette.

A robot assembly is supported by a linear traveling assembly between adjacent port plate apertures for removing and inserting wafer specimens from the transport box. The linear traveling assembly includes a nut mechanism contained within a housing secured to a carriage that supports the robot assembly. The carriage travels along a lead screw between the port plate apertures and is driven by the nut mechanism that includes a lead nut threadably engaged with the lead screw and rotated by a drive motor through a belt and pulley arrangement.

Additional objects and advantages of this invention will be apparent from the following detailed description of a preferred embodiment thereof which proceeds with reference to the accompanying drawings.

BRIEF DESCRIPTION OF THE DRAWINGS

FIGS. 3A–3G show various views of a front-opening wafer carrier box and its components and features.

FIG. 8 is an enlarged front elevation view of the box load interface with the sheet metal cover removed to show the elevator assembly.

FIG. 9 is a left side elevation view of the box load interface of FIG. 8.

FIG. 10 is an exploded view and FIGS. 11A, 11B, and 11C are respective side, front, and rear elevation views of the latch key assembly.

DETAILED DESCRIPTION OF A PREFERRED EMBODIMENT

Figure 1:
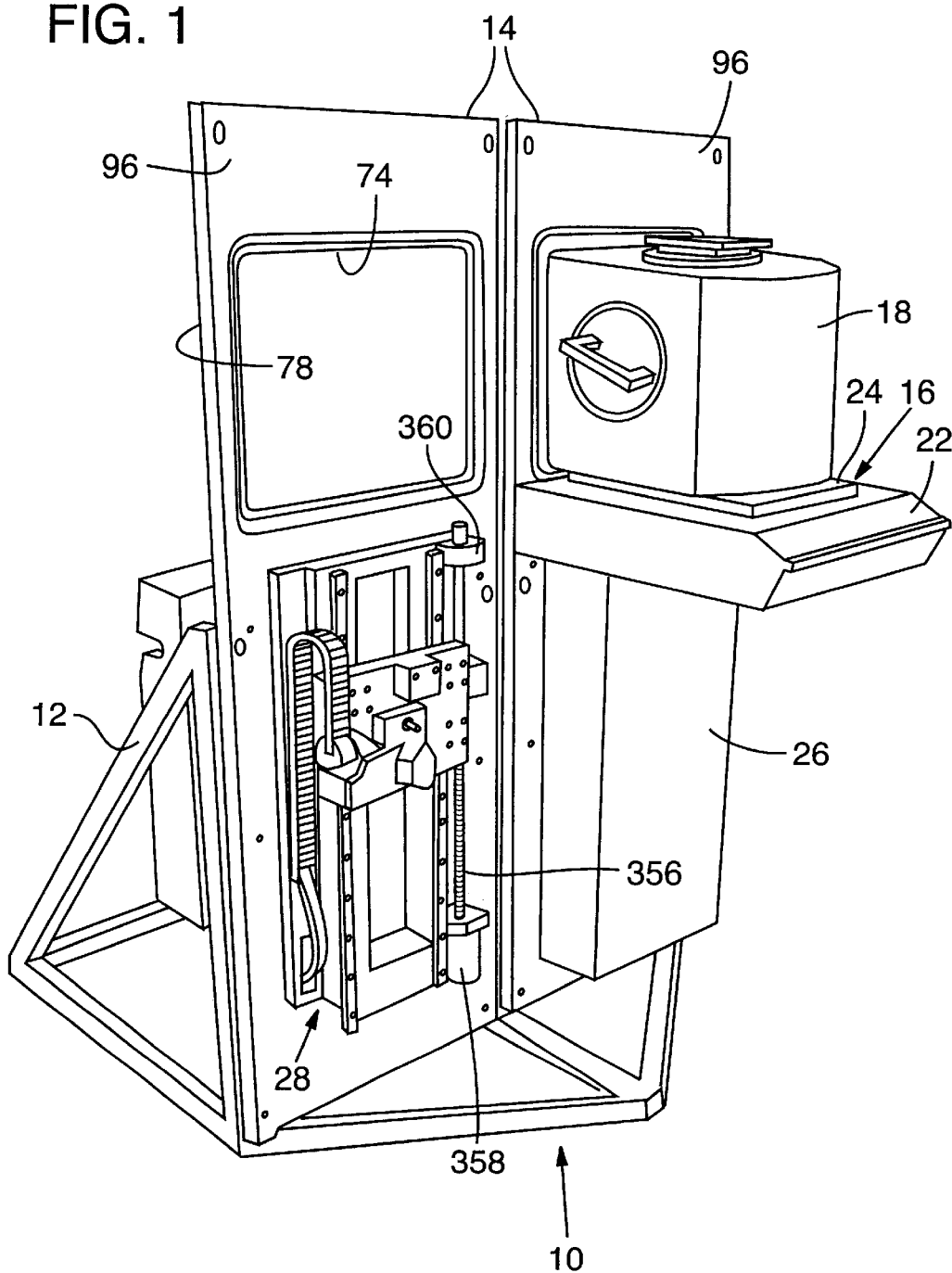
FIGS. 1 and 2 are respective front and rear perspective views of a wafer transport system in which a box load interface of the present invention for use in a FIMS system is implemented.
Figure 2:
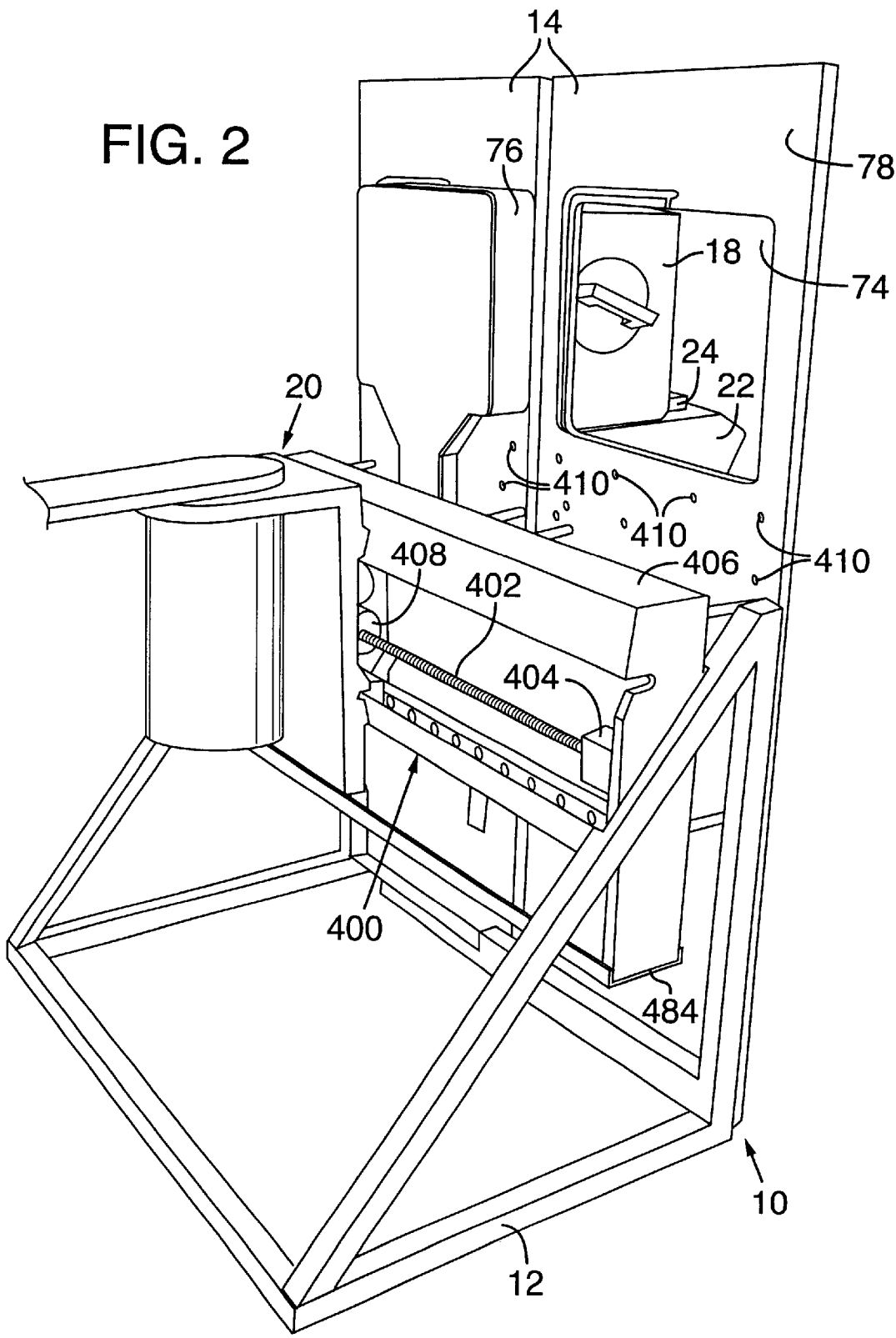

FIGS. 1 and 2 show a wafer transport system 10 that has an assembly frame 12 to which two front or port plates 14 are attached. Each front plate 14 supports one of two substantially identical box load interface systems 16 for front-opening semiconductor wafer carrier boxes 18 and a linear traveling robot assembly 20 positioned to access the wafers stored in carrier boxes 18 after they have been opened. A right side interface system 16 is shown with a shelf 22 having a slidable tray 24 supporting a carrier box 18; and a left side interface system 16 is shown partly disassembled without a carrier box 18, a shelf 22, and a sheet metal cover 26 to show the components of an elevator assembly 28.

FIGS. 3A–3G show various views of carrier box 18 and its components and features.

Figure 3A:
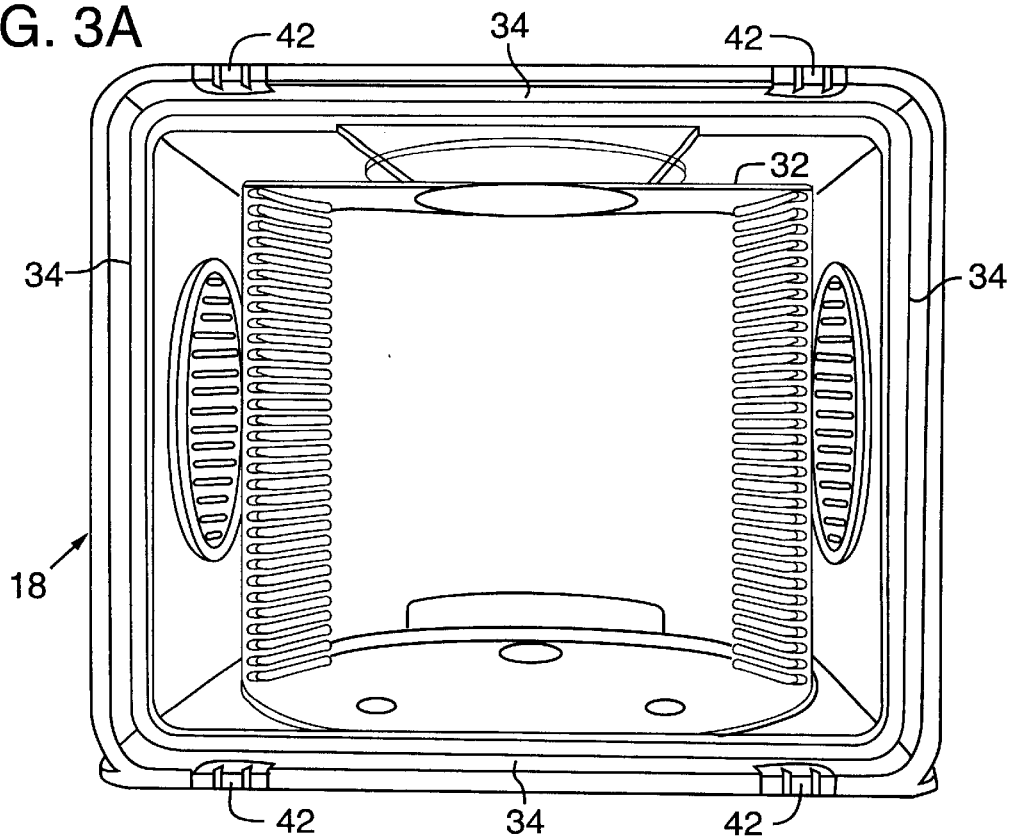

FIG. 3A shows carrier box 18 with its box door 30 removed to reveal in the interior of carrier box 18 a wafer cassette 32 with slots spaced apart to accommodate 300 mm diameter semiconductor wafers. Carrier box 18 has a recessed, stepped interior side margin 34 against which the perimeter of an interior surface 36 of box door 30 rests when carrier box 18 is closed.

Figure 3B:
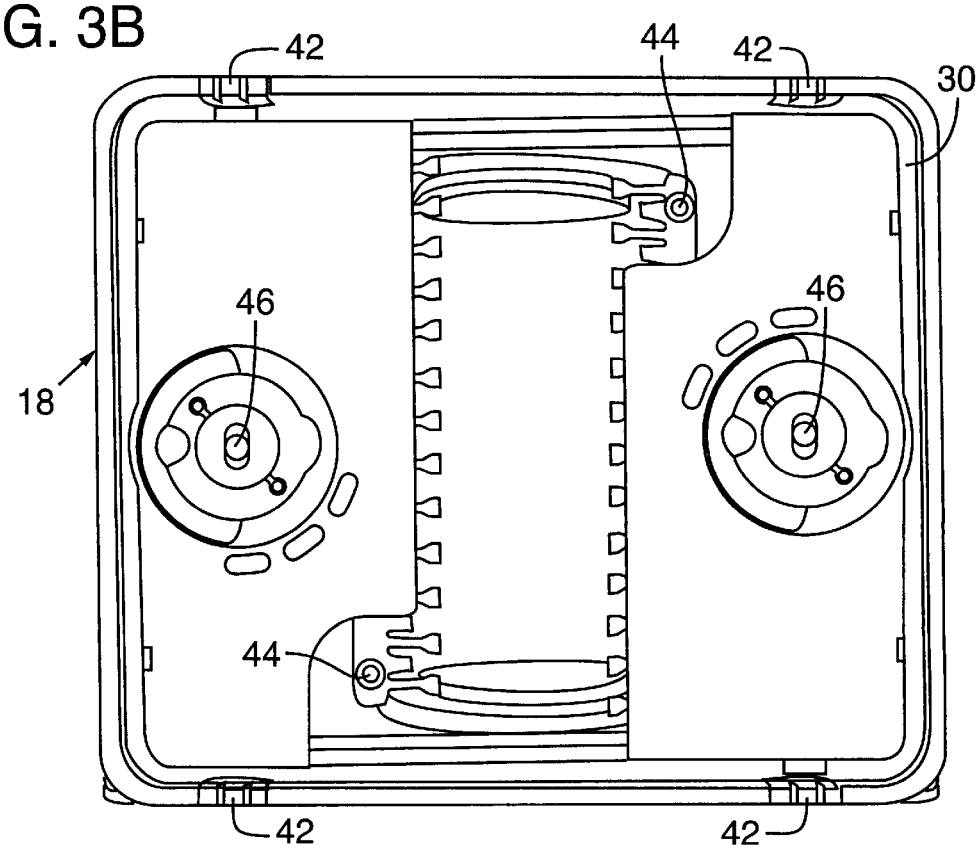
Figure 3C:
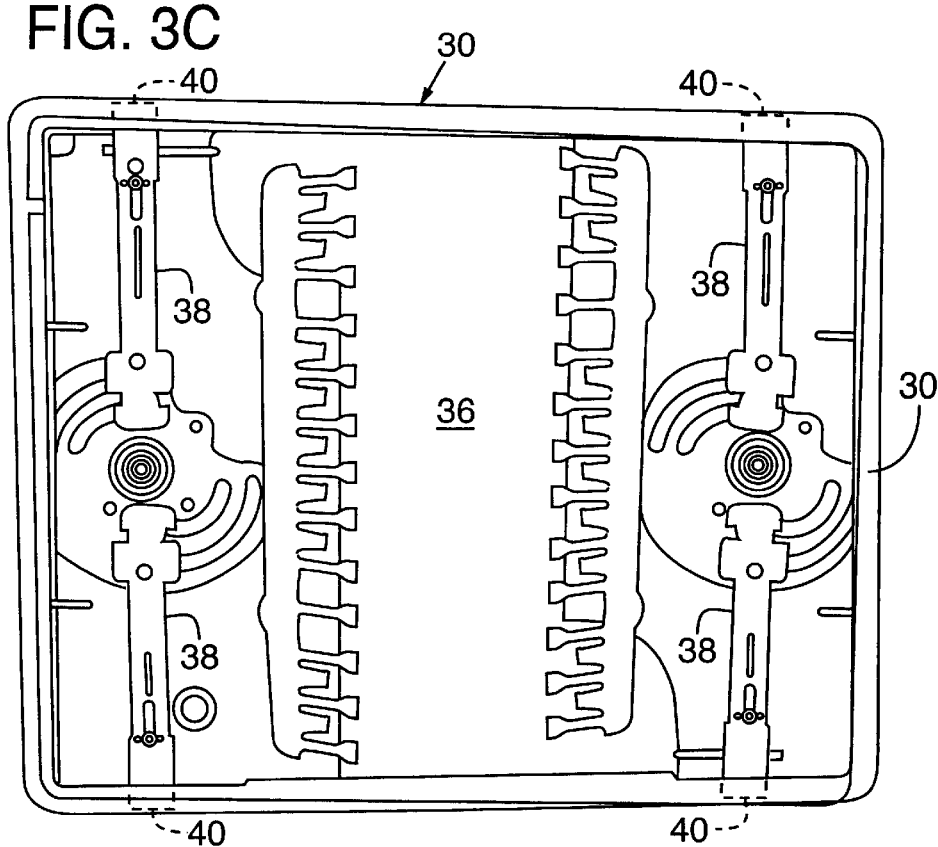
Figure 3D:
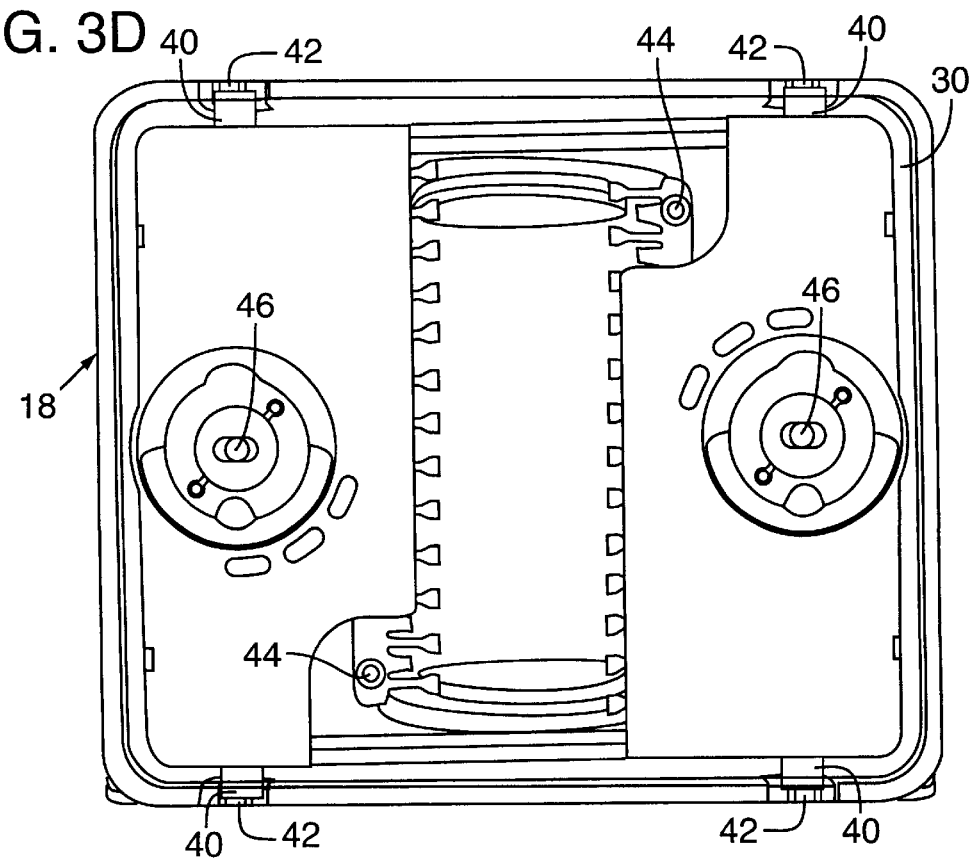

FIGS. 3B and 3C show, respectively, carrier box 18 closed with box door 30 unlocked and interior surface 36 of box door 30 in its unlocked condition; and FIGS. 3D and 3E show, respectively, carrier box 18 closed with box door 30 locked and interior surface 36 of box door 30 in its locked condition. FIG. 3C shows four locking slats 38 fully retracted so that their end tabs 40 remain inside the interior of box door 30, and FIG. 3E shows locking slats 38 fully extended so that their tab ends 40 extend outwardly of the top and bottom side margins of box door 30.

FIG. 3B shows end tabs 40 positioned outside of slots 42 located in the outermost portion of recessed side margin 34 when box door 30 is unlocked, and FIG. 3D shows end tabs 40 fitted into slots 42 when box door 30 is locked in place. FIGS. 3B and 3D also show two locator pin depressions 44 and two box lock actuating mechanism slots 46 required by the SEMI specification for a FIMS box door.

Figure 3F:
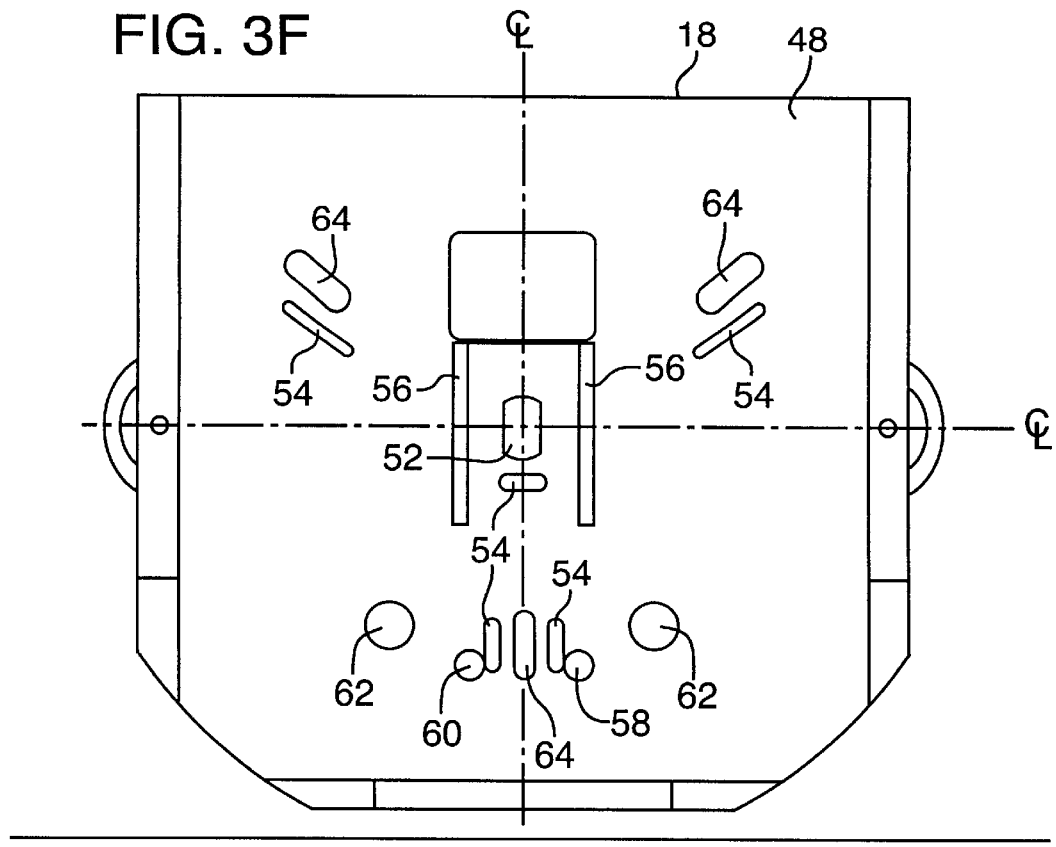
Figure 3G:
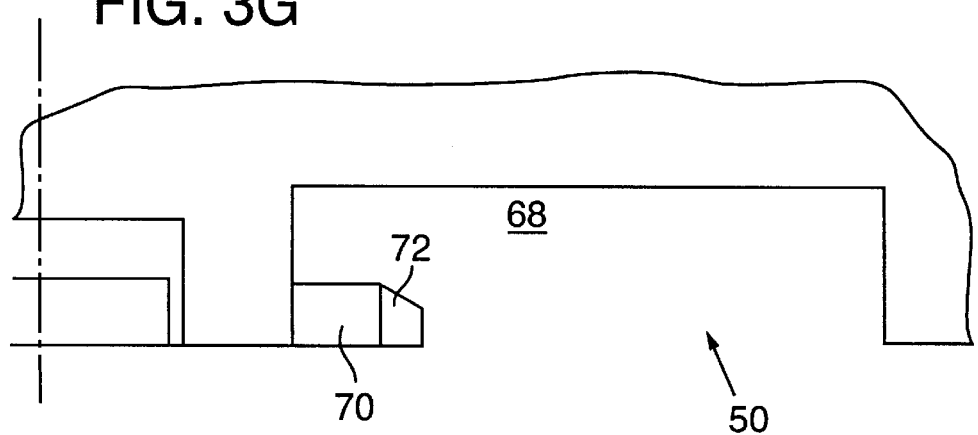

FIGS. 3F and 3G show, respectively, a bottom surface 48 and a box front retaining feature 50 on bottom surface 48 of a front-opening carrier box 18. A preferred box 18 is a model F300 wafer carrier manufactured by Fluoroware, Inc., Chaska, Minn. With reference to FIG. 3F, box 18 has on its bottom surface 48 five carrier sensing pads 54, two advancing box sensing pads 56, a carrier capacity (number of wafers) sensing pad 58, a box or cassette information pad 60, and one each of front end of line (FOEL) and back end of line (BOEL) information pads 62 required under SEMI E47.1 (Mar. 5, 1998). Three oblong, inwardly sloped depressions in bottom surface 48 form kinematic pin receiving features 64 that mate with kinematic coupling pins 66 (FIG.

4) fixed in corresponding locations on slidable tray 24 when box 18 is properly installed. When box 18 is placed in proper alignment on slidable tray 24, sensing pads 54 and 58 and information pads 60 and 62 contact switches mounted in corresponding positions on slidable tray 24 and advancing box sensing pads 56 contact switches mounted in corresponding positions on shelf 22.

With reference to FIGS. 3F and 3G, a depression 68 partly covered by a projection 70 having a beveled surface 72 forms a front retaining or clamping feature 68. Beveled surface 72 provides a ramp along which a wheel or roller can roll up while tray 24 slides box 18 toward an aperture 74 in front plate 14 to mate with a port door 76 (FIGS. 4, 5, 8, 9, 12, and 13) secured to an interior surface 78 of front plate 14.

Figure 4:
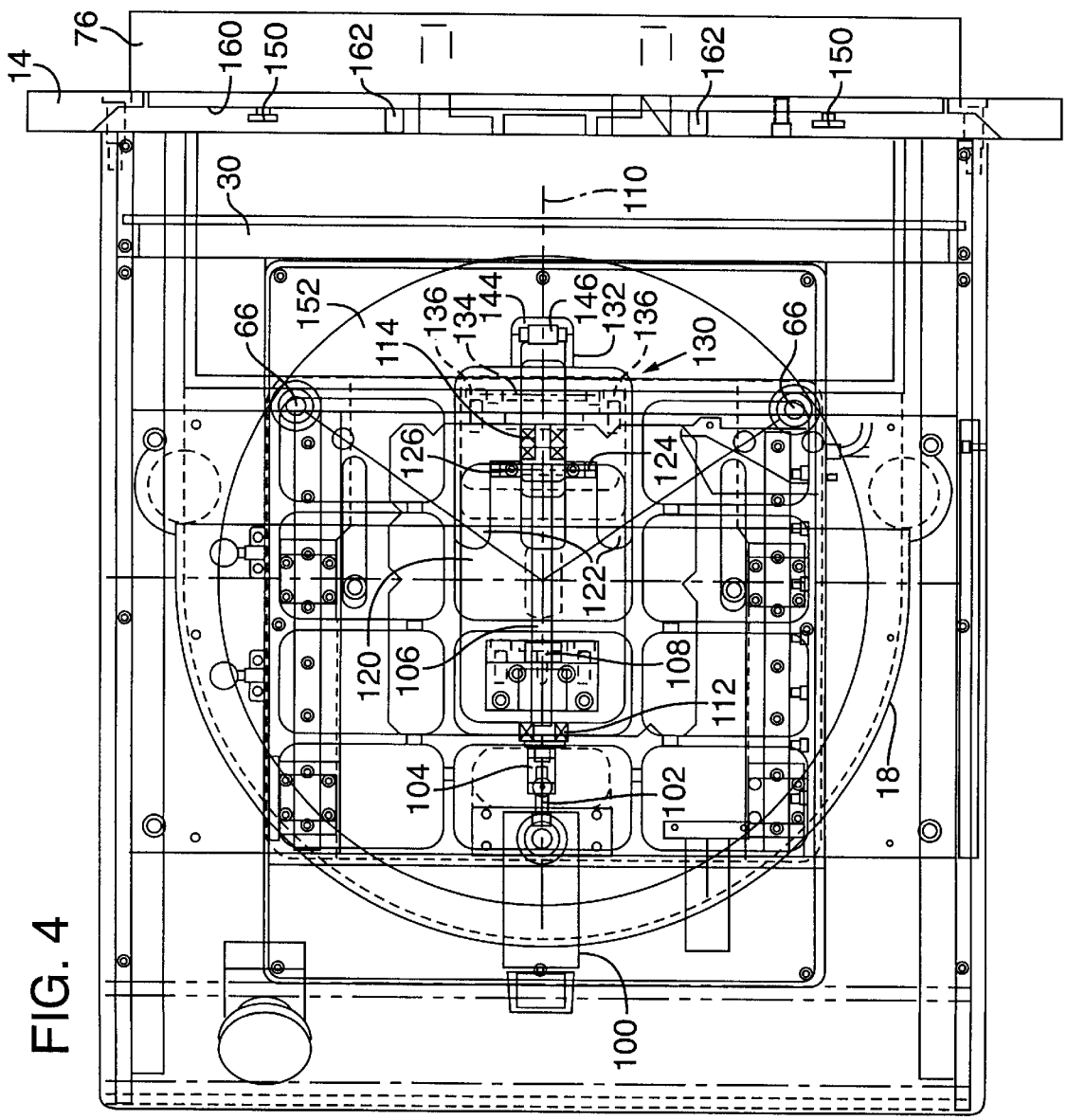
FIG. 4 is a plan view of a front-opening carrier box positioned on the slidable tray mounted to the interface system shelf with its top cover removed to show the slidable tray positioning mechanism components.
Figure 5:
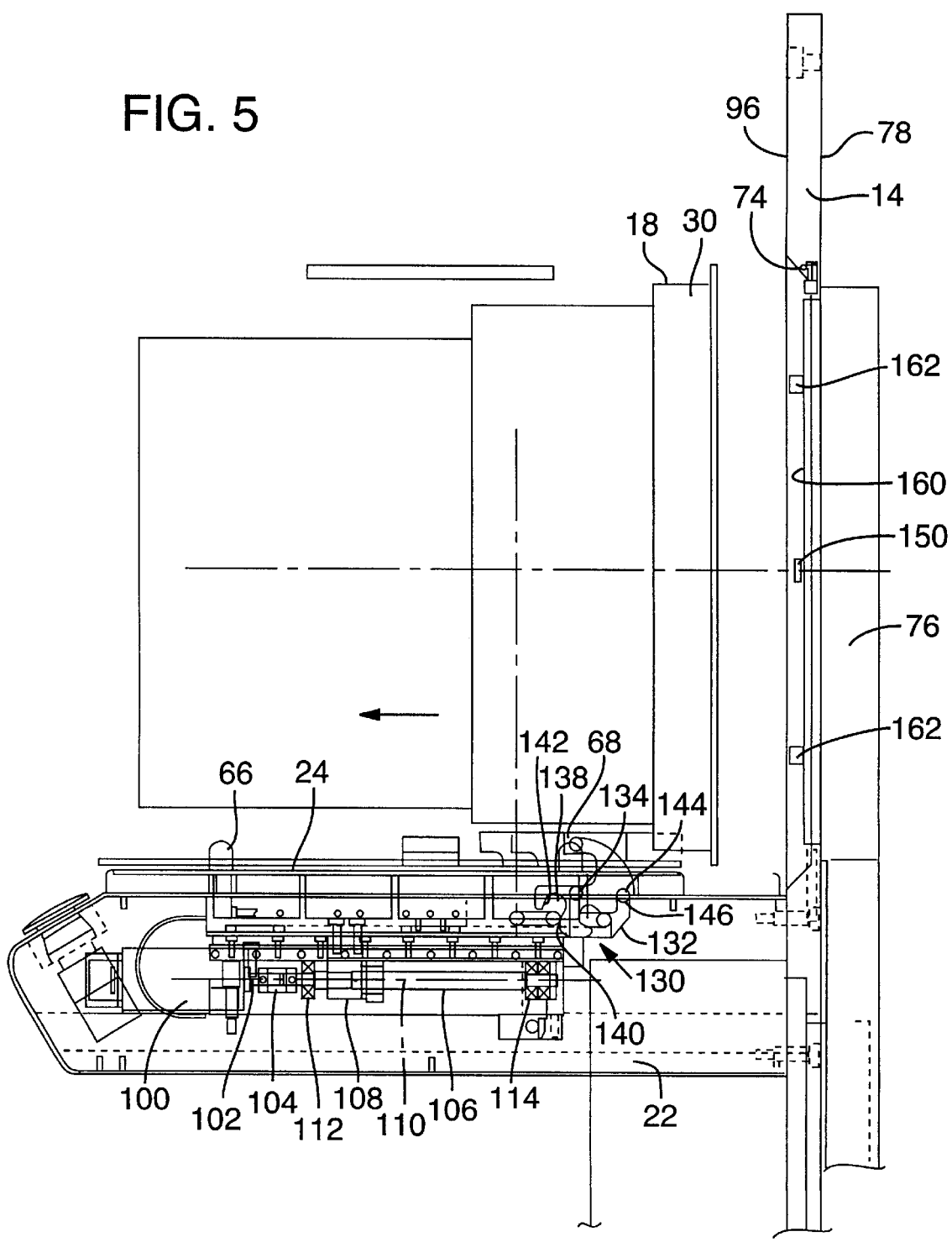
FIG. 5 is a side elevation view of the front-opening carrier box positioned on the interface system as shown in FIG. 4 but with the side cover of the interface system shelf removed.
Figure 6:
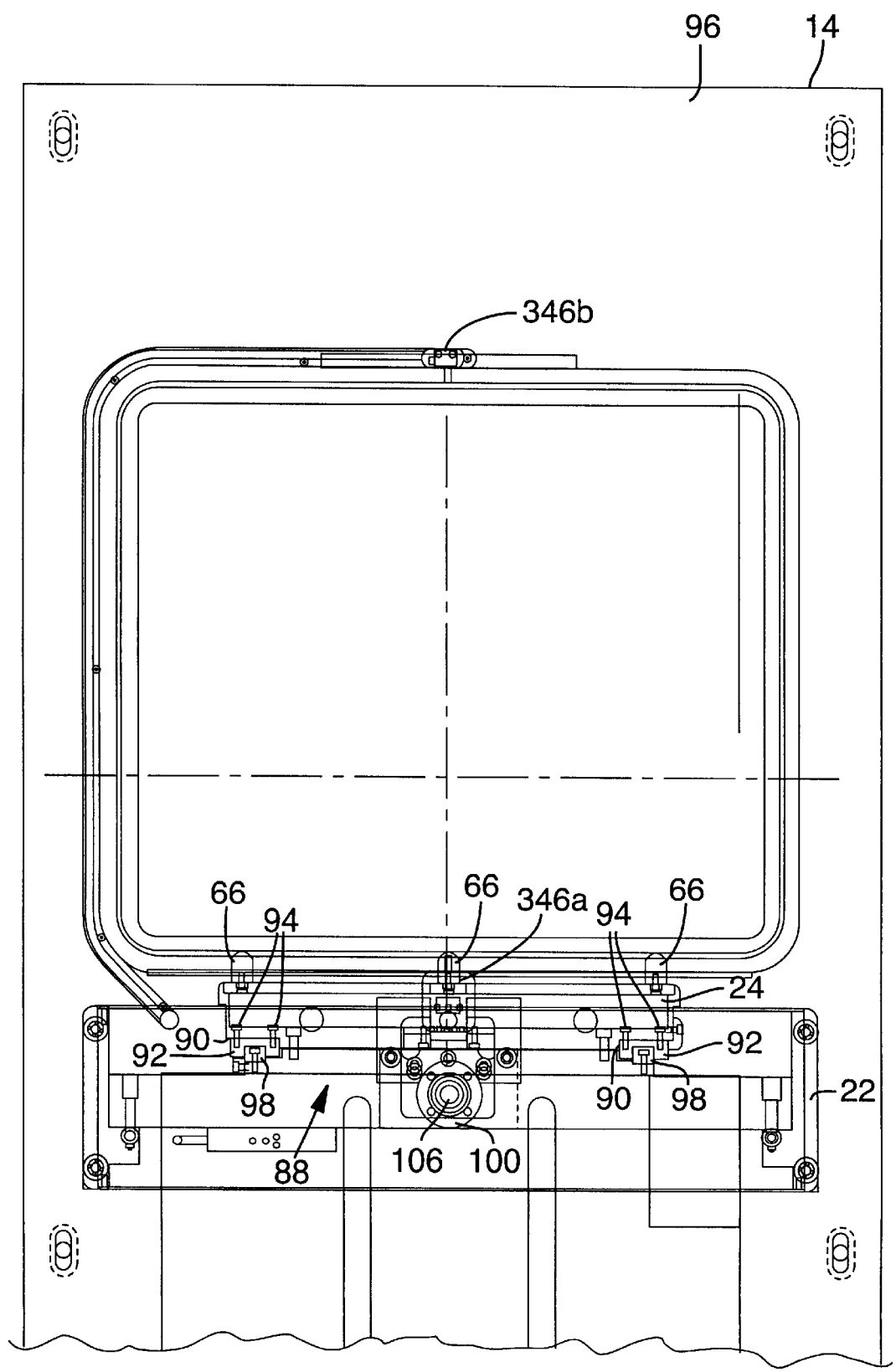
FIG. 6 is a front side elevation view of the slidable tray and shelf with the carrier box and front cover removed.
Figure 7A:
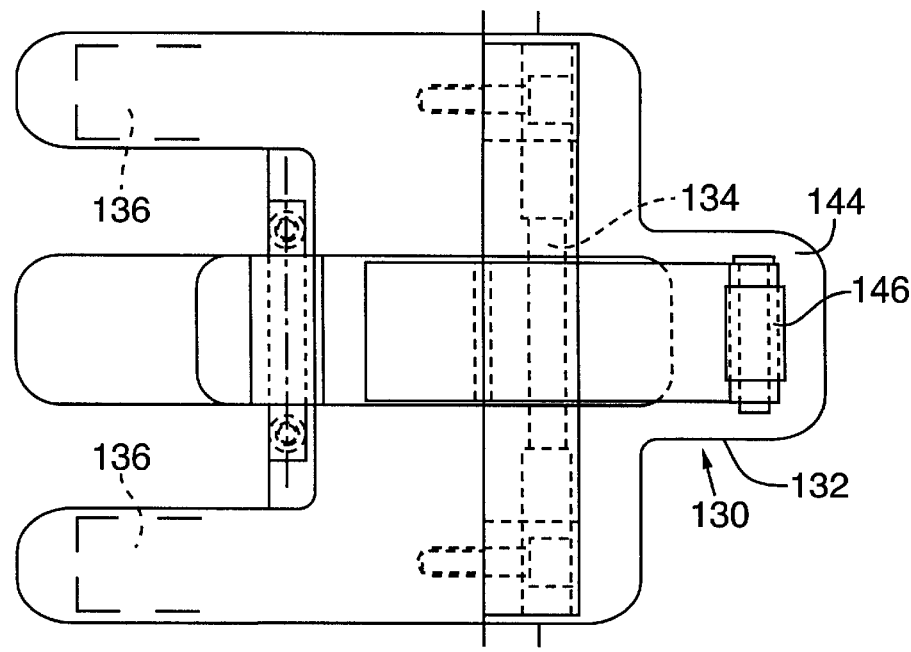
FIGS. 7A and 7B are plan and side elevation views of the carrier box clamping feature shown in FIGS. 4, 5, and 6.
Figure 7B:
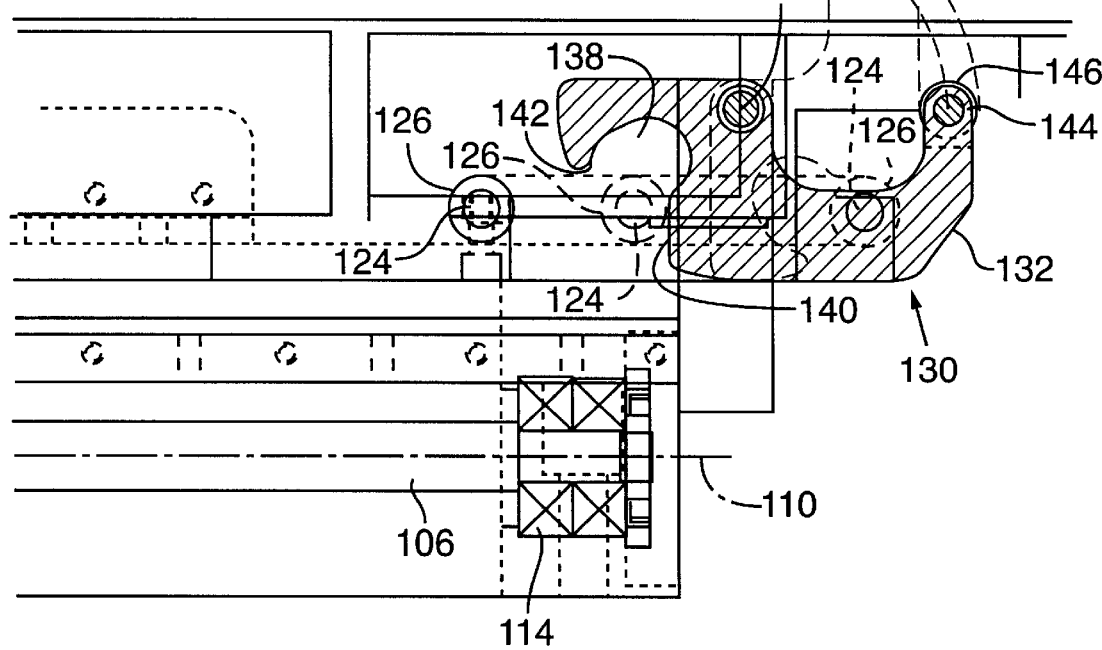

FIGS. 4, 5, 6, 7A, and 7B show carrier box 18 placed on slidable tray 24 with portions shown in phantom lines to indicate the operation of a slidable tray positioning mechanism 88. With particular reference to FIGS. 4 and 6, slidable tray 24 has a bottom surface 90 to which two U-shaped guide rails 92 are fixed by bolts 94. Guide rails 92 extend near the side margins of slidable tray 24 in a direction perpendicular to an exterior surface 96 of front plate 14. Two guide tracks 98 are bolted to shelf 22 in positions to receive guide rails 92 so that slidable tray 24 can move in a direction toward and away from exterior surface 96 of front plate 14 in response to the operation of tray positioning mechanism 88.

Tray positioning mechanism 88 is mounted to shelf 22 and includes a tray motor 100 from which a shaft 102 extends to a coupler 104 that operatively joins shaft 102 to rotate a lead screw 106 that passes through a nut assembly 108. Lead screw 106 has an axis 110 and is supported at a proximal end in a tail bearing 112 and at a distal end in a preloaded bearing 114. Nut assembly 108 is fixed to bottom surface 90 of slidable tray 24 to move it in a direction along lead screw axis 110.

Slidable tray 24 has in its bottom side an open region 120 into which two support members 122 extend in a direction parallel to tray bottom surface 90 to hold at their ends a push pin 124 carrying a cylindrical roller bearing 126. A pivotable latch 130 includes a clamping finger 132 mounted to a pivot pin 134 supported between pivot mounting blocks 136 that extend upright from shelf 22 and through open region 120 of tray 24. Clamping finger 132 has a recessed area 138 that forms a first contact surface 140 and a second contact surface 142 that are angularly offset from each other and a hooked end 144 to which a cylindrical roller bearing 146 is mounted. Push pin 124 is set in a position to contact first and second contact surfaces 140 and 142 as slidable tray 24 moves in response to the operation of tray positioning mechanism 88 so as to, respectively, engage clamping feature 68 with and disengage clamping feature 68 from hooked end 144 of clamping finger 132 in accordance with the following operational sequence.

Whenever carrier box 18 is to be positioned against front plate 14 to mate box door 30 with port door 76, tray motor 100 rotates lead screw 106 in a first lead screw rotational sense to advance nut assembly 108 and thereby translate slidable tray 24 along shelf 22 in a direction toward front plate 14. This movement of slidable tray 24 causes roller bearing 126 to contact first contact surface 140 and as a consequence cause clamping finger 132 to rotate about pivot pin 134. As slidable tray 24 continues to advance toward front plate 14, clamping finger 132 continuously rotates in a first clamping finger rotational sense so that hooked end 144 rolls up beveled surface 72 and fits within box clamping feature 68 and so that roller bearing 126 fits within recessed area 138. The distances separating roller bearing 126, pivot pin 134, and front plate 14 are set so that box door 30 mates with port door 76 and a front side margin 148 (FIG. 3A) of carrier box 18 is in a sealing relationship with exterior surface 96 of front plate 14 when hooked end 144 fully engages clamping feature 68. Full engagement of clamping feature 68 urges carrier box 18 against kinematic coupling pins 66 so that it is not dislodged when latch keys 150 extending from port door 76 unlock and remove box door 30.

Whenever carrier box 18 is to be retracted from front plate 14 after box door 30 has separated from port door 76 and sealed carrier box 18, tray motor 100 rotates lead screw 106 in a second lead screw rotational sense that is opposite to the first lead screw rotational sense to retract nut assembly 108 and thereby translate slidable tray 24 along shelf 22 in a direction away from front plate 14. This movement of slidable tray 24 causes roller bearing 126 to roll out of recessed area 138 and contact second contact surface 142 and as a consequence cause clamping finger 132 to rotate about pivot pin 132. As slidable tray 24 continues to retract from front plate 14, clamping finger 132 continually rotates in a second clamping finger rotational sense that is opposite to the first clamping finger rotational sense so that its hooked end 144 rolls down beveled surface 72 and separates from box clamping feature 68. Full disengagement of clamping feature 68 releases the urging force applied to carrier box 18 against kinematic coupling pins 66 so that carrier box 18 at its contents (one semiconductor wafer 152 shown in FIG. 4) can be removed from slidable tray 24.

FIGS. 8 and 9 are respective front and side elevation views of box load interface system 16 showing the spatial relationship of port door 76 and other system components when port door 76 is in a fully elevated position in which it is aligned with and can fit within aperture 74 of front plate 14. With reference to FIG. 8, port door 76 has a front surface 160 on which two locating pins 162 are positioned to mate with locator pin depressions 44 (FIGS. 3B and 3D) in box door 30 when it and port door 76 are brought into contact by the operation of tray positioning mechanism 88. A box presence switch 164 is positioned below each locating pin 162 to provide an electrical signal indicating that box door 30 is properly registered with port door 76 when they are in matable connection. Two pod door latch key assemblies 166 are rotatably positioned within port door 76. Latch key assemblies 166 include laterally compliant latch keys 150 extending through front surface 160 to fit into spatially aligned slots 46 (FIGS. 3B and 3D) in box door 30 to operate its latching mechanism.

FIG. 10 is an exploded view and FIGS. 11A, 11B, and 11C are respective side (partly in section), front, and rear elevation views of latch key assembly 166. With reference to FIGS. 10 and 11A and 11C, latch key assembly 166 includes a latch key housing 168 that fits within and is secured by bolts passing through counterbored bolt holes 170 to a component of a latch key motor mechanism 172 (FIGS. 12 and 13) positioned behind front surface 160 of and within port door 76. Latch key housing 168 is of cylindrical shape having a neck portion 174 and a base portion 176 of greater diameter. A latch key body 178 has positioned at one end a latch key 150 connected to a shaft that includes concatenated cylindrical portions 180, 182, and 184 of different diameters. Cylindrical portion 184 has located between its ends a hexagonal section 186. Latch key housing 168 has a centrally located stepped bore 188 that receives latch key body 178 and includes a hexagonal section 190 of complementary shape to the shape of and of the same length as the length of hexagonal section 186. Neck portion 174 and cylindrical portion 180 are of the same diameter so that they abut each other, and the width (i.e., the distance between opposite sides) of hexagonal section 190 is slightly larger than the width (i.e., distance between opposite faces) of hexagonal section 186 to permit lateral motion of latch key body 178 within latch key housing 168. A coil spring 192 fitted within a counterbored region 194 in latch key housing 168 and a clip ring 196 fitted around an annular recess 198 in cylindrical portion 184 holds latch key assembly 166 together as a single unit.

Latch key housing 168 and latch key body 178 are provided with respective complementary hexagonal sections 190 and 186 to prevent mutual rotation between them. Both latch key assemblies 166 are rotated between first and second angular positions to open and close box door 30. The widths of hexagonal sections 190 and 186 are slightly different to form a compliant latch key 168 that can "wobble" laterally to accommodate the tolerance range of the corresponding slot 46 in box door 30 and thereby ensure proper alignment to it.

With reference again to FIG. 9, port door 76 is shown in matable connection with box door 30, with latch key 150 turned in secure position within box door slot 46. Each latch key housing 168 carries on its neck portion 174 a bearing 210 that is supported on an interior surface 212 of port door 76.

Figure 12:
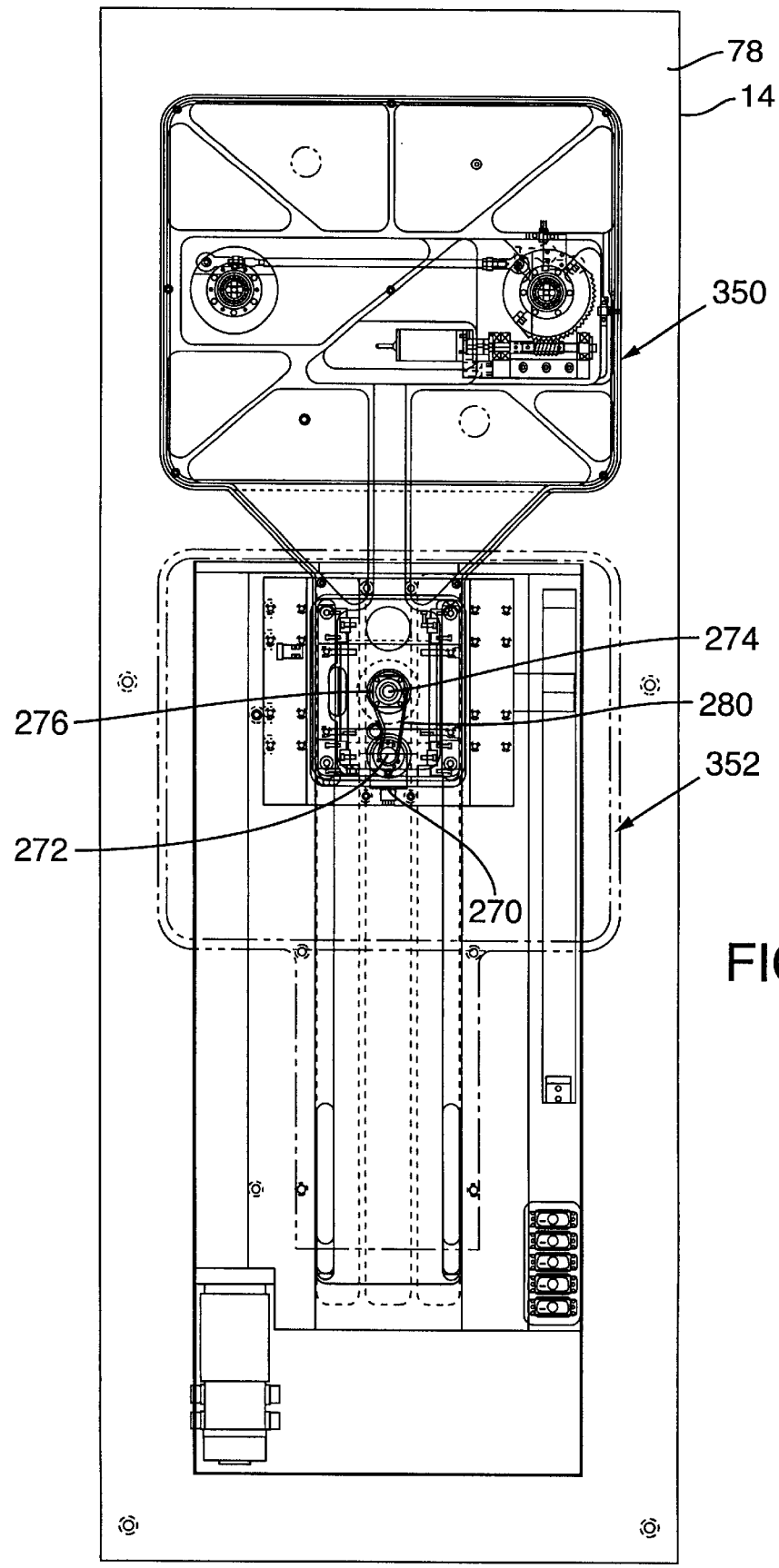
FIG. 12 is a rear elevation view of the latch key motor mechanism mounted in the port door and the port door translation mechanism mounted on the interior surface of the front plate.
Figure 13:
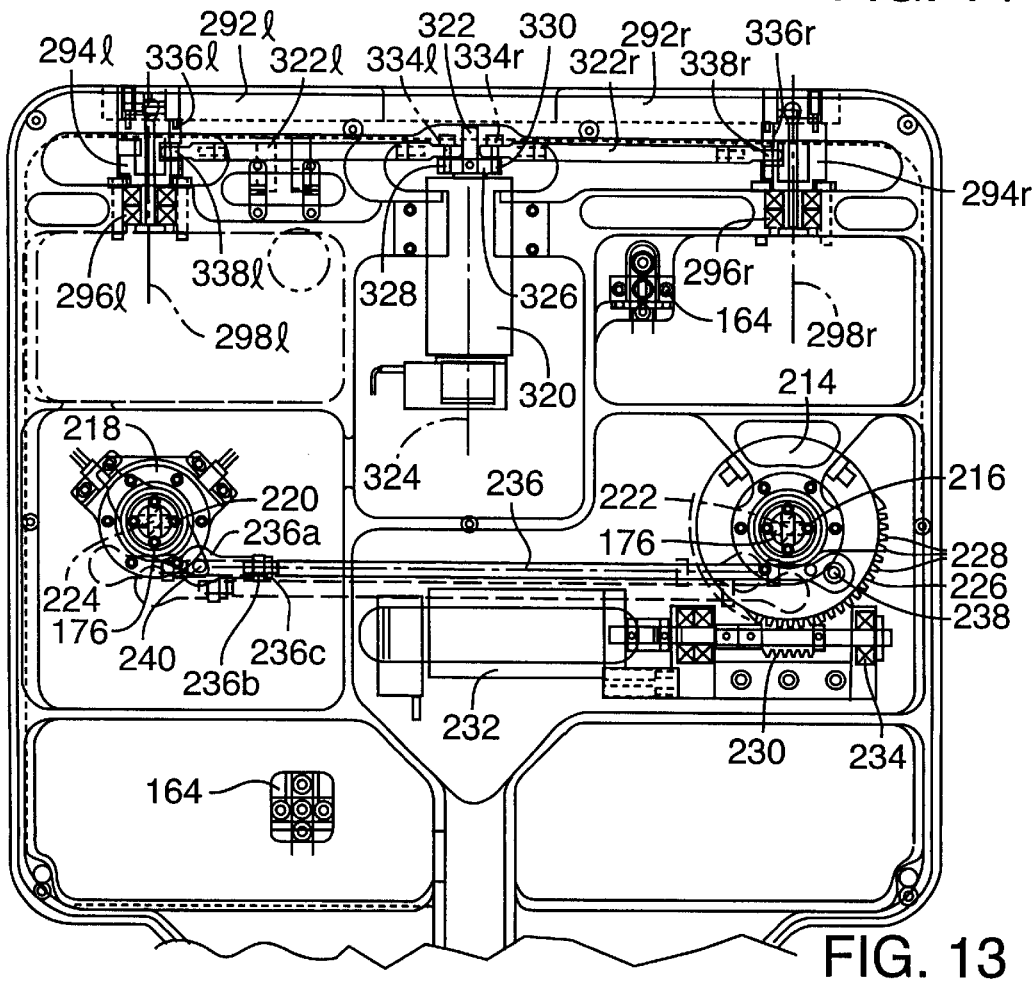
FIG. 13 is an enlarged rear elevation view of the latch key motor mechanism shown in FIG. 12 and of the positioning mechanism for the wafer scanning assembly.

FIGS. 12 and 13 show latch key motor mechanism 172, which rotates latch keys 150 between the first and second angular positions to lock and unlock box door 30 of carrier box 18. With reference to FIGS. 12 and 13, base portion 176 of one latch key housing 168 is fixed to a master disk member 214 by bolts 216 engaging tapped bolt holes 170, and base portion 176 of the other latch key housing 168 is fixed to a slave disk member 218 by bolts 220 engaging tapped bolt holes 170. Disk members 214 and 218 and therefore their corresponding latch keys 150 are mounted for rotation about respective axes 222 and 224. Master disk member 214 includes a worm gear section 226 having worm gear teeth 228 with which a worm gear shaft 230 driven at one end by a motor 232 and terminated at the other end in a bearing 234 engages to move disk member 214 and thereby its corresponding latch key 150 about axis 222 between the first and second angular positions. The operation of motor 232 is controlled to provide a 90° displacement between the first and second angular positions.

An elongated coupling or rod member 236 of adjustable length is mounted at its proximal end to disk member 214 for pivotal movement about a first rod pivot axis 238 and at its distal end to disk member 218 for pivotal movement about a second rod pivot axis 240. Rod member 236 is composed of a spherical joint 236a and a turnbuckle portion 236b coupled at each of its ends by locknuts 236c that after rotary adjustment fix the length of rod member 236. Disk member 218 is slaved to the motion of disk member 214 and thereby moves its corresponding latch key 150 about axis 224 between the first and second angular positions. Spherical joint 236a facilitates the length adjustment of rod member 236 without disassembly by rotation of turnbuckle portion 236b but is otherwise not needed to practice the invention.

FIGS. 8, 9, and 12 show a port door translation mechanism 250 mounted to a port door carriage mechanism 252 to which elevator assembly 28 is operatively connected. Port door 76 has guide tracks 254 that slide along guide rails 256 on port door carriage mechanism 252 so that it can move port door 76 toward or away from interior surface 78 of front plate 14 when port door 76 is aligned with aperture 74.

Port door 76 includes an upper rectangular section 258 that houses latch key motor mechanism 172 and a lower rectangular section 260 that houses port door translation mechanism 250. Upper section 258 of port door 76 includes a stepped region 262 of a height that defines a surface portion 264 and causes port door 76 to form a sealed connection against interior surface 78 of front plate 14 as surface portion 264 fits within aperture 74 to present latch keys 150 to mate with slots 46 in box door 30. Lower section 260 of port door 76 supports a motor 270 coupled to a spindle 272 and a lead screw 274 connected at one end to a pulley 276 and supported at the other end in a preloaded bearing 278. A belt 280 connecting spindle 272 to pulley 276 causes lead screw 274 to rotate and drive a nut assembly 280 to cause port door 76 to slide along guide rails 256 toward or away from interior surface 78, depending on the direction of lead screw rotation.

Because surface portion 264 is sized to fit within aperture 74, motor 270 is not operated unless elevator assembly 28 has moved port door carriage mechanism 252 to its uppermost position. Elevator assembly 28 moves port door carriage mechanism 252 to its lowermost position after port door translation mechanism 250 has moved port door 76 completely away from interior surface 78 of port plate 14.

Figure 14:
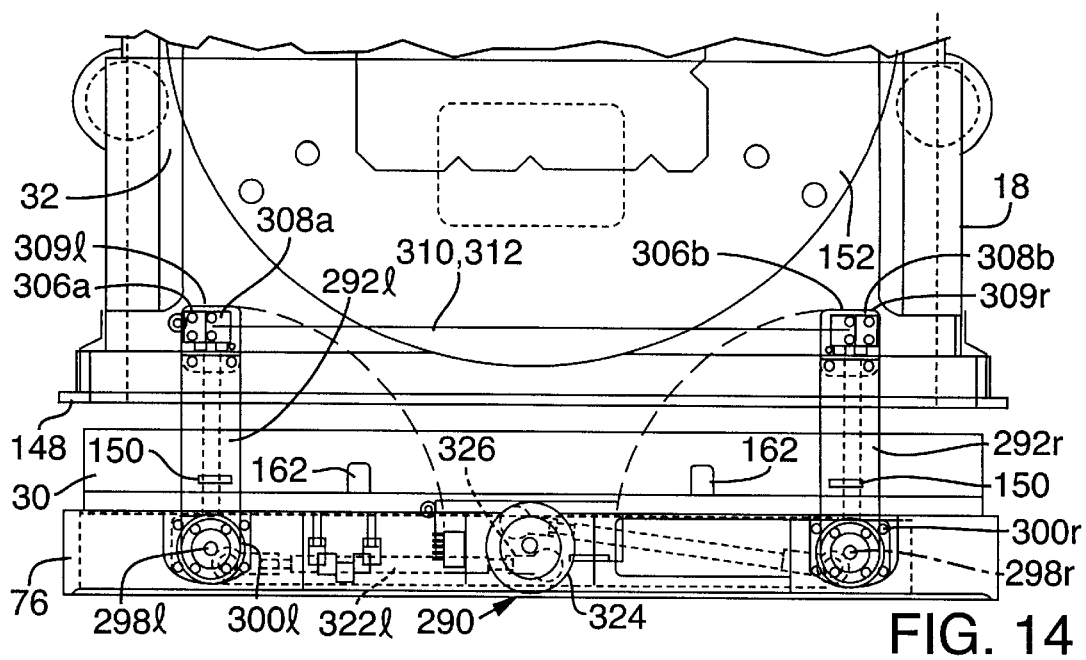
FIGS. 14 and 15 are respective plan and side elevation views of the wafer scanning assembly mounted on the port plate.
Figure 15:
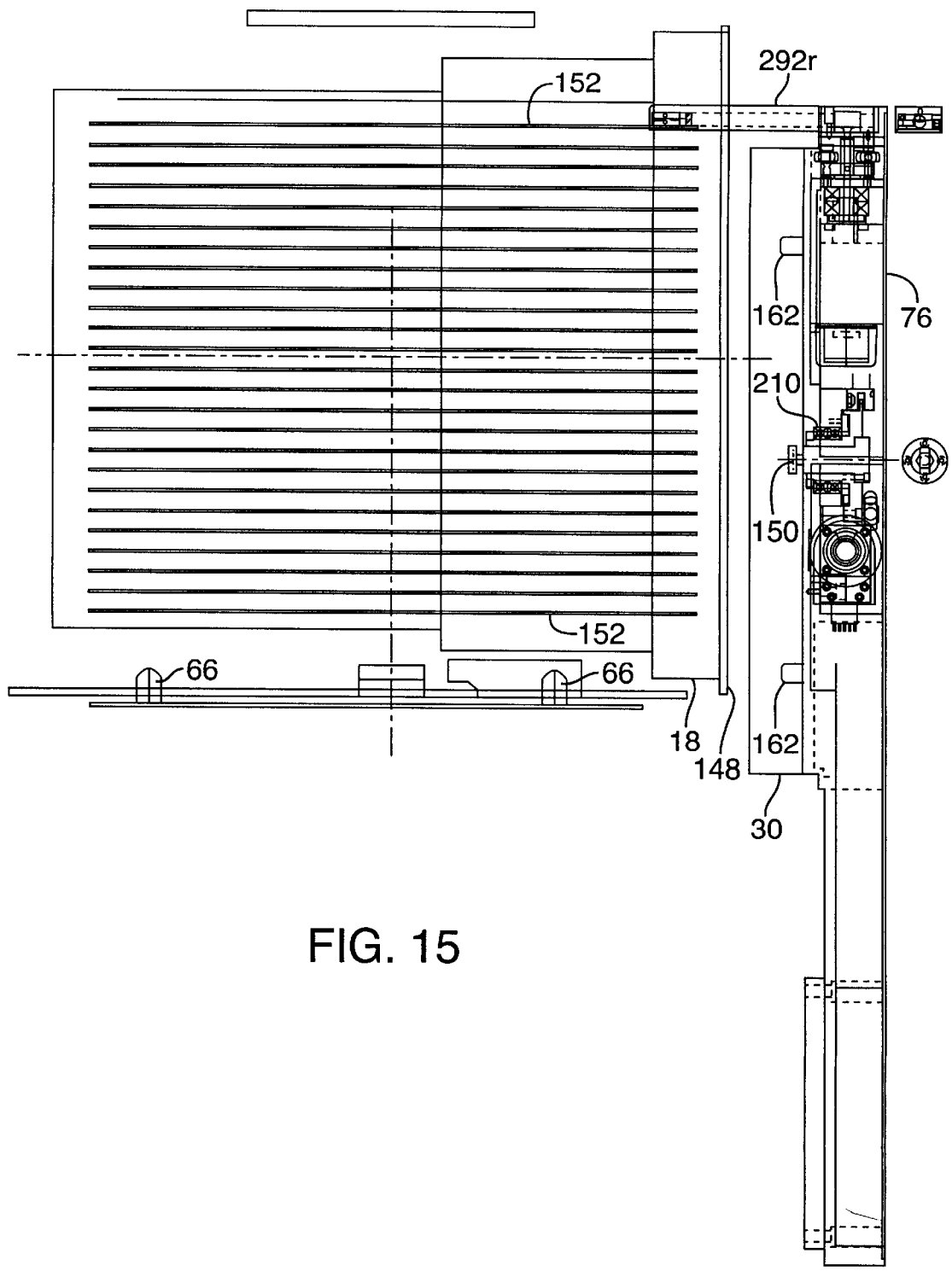

FIGS. 13, 14, and 15 show respective rear elevation, plan, and side elevation views of a differential, transmissive optical scanning assembly 290 mounted within the interior and in a recess near the top side of port door 76. Scanning assembly 290, which operates in conjunction with elevator assembly 28, includes two scanning fingers 292*l* and 292*r*, the former having a finger shaft 294*l* mounted for pivotal movement in a bearing 296*l* about a finger pivot axis 298*l* at a proximal end 300*l* and the latter having a finger shaft 294*r* mounted for pivotal movement in a bearing 296*r* about a finger pivot axis 298*r* at a proximal end 300*r*. Scanning finger 292*l* supports light sensors 306a and 308a positioned one on top of the other at a distal end 309*l*. Scanning finger 292*r* supports light emitters 306b and 308b positioned one on top of the other at a distal end 309*r*. A light propagation path 310 between light sensor 306a and light emitter 306b and a light propagation path 312 between light sensor 308a and light emitter 308b are coplanar in a direction normal to the major surface of wafer 152. Light propagation paths 310 and 312 cross over at a point 314 (FIG. 17) in the plane.

A scanner motor 320 mounted within port door 76 includes a central shaft 322 having an axis of rotation 324 set at an equidistant position between finger pivot axes 298*l* and 298*r*. Central shaft 322 carries a disk member 326 to which are mounted two stationary pins 328 and 330 angularly spaced apart from each other to carry out the function described below. A rod member 322*l* is mounted at a proximal end to pin 328 on disk member 326 for pivotal movement about a rod proximal pivot axis 334*l* and at its distal end to a coupling recess mount 336*l* in finger shaft 294*l* for pivotal movement about a rod distal pivot axis 338*l*. A rod member 332*r* is mounted at a proximal end to pin 330 on disk member 326 for pivotal movement about a rod proximal pivot axis 334*r* and at its distal end to a coupling recess mount 336*r* in finger shaft 294*r* for pivotal movement about a rod distal point pivot axis 338*r*.

Scanner motor 320 imparts ±45° reciprocal motion to central shaft 322 and pins 328 and 330 are angularly spaced apart on disk member 326 to pivotally move scanning fingers 292*l* and 292*r* between fully extended positions (shown in solid lines in FIG. 14) and fully retracted positions (shown in phantom lines in FIG. 14). Thus, scanning fingers 292*l* and 292*r* move 90° about their respective finger pivot axes 298*l* and 298*r* between the fully extended and fully retracted positions. FIG. 14 shows that the respective distal ends 309*l* and 309*r* of scanning fingers 292*l* and 292*r* in their fully extended positions straddle wafers 152 stored in wafer cassette 32 and the light propagation paths 110 and 112 intersect a chord of each of wafers 152 as they are scanned.

When they are fully extended, sensors 306*a* and 308*a* and emitters 306*b* and 308*b* are located inside of the region where a wafer carrier box 18 would occupy and are aligned to form two light propagation paths 310 and 312 that cross each other. The presence of a wafer 152 aligned to intersect one or both light propagation paths 310 and 312 interrupts light propagating from one or both of emitters 306*b* and 308*b* from reaching its corresponding sensor 306*a* and 308*a*. Thus, interruption of one or both of the light propagation paths provides information that can be used to position robot assembly 20 for wafer pickup or to determine the presence or absence of a wafer 152 in a slot in wafer cassette 32, whether two wafers 152 occupy the same slot in wafer cassette 32, or whether a wafer 152 occupies two slots (i.e., in a cross slot position) in wafer cassette 32. The mounting configuration and operation of light beam sensors 306*a* and 308*a* and emitters 306*b* and 308*b* are described below with particular reference to FIGS. 16A and 16B.

Figure 16A:
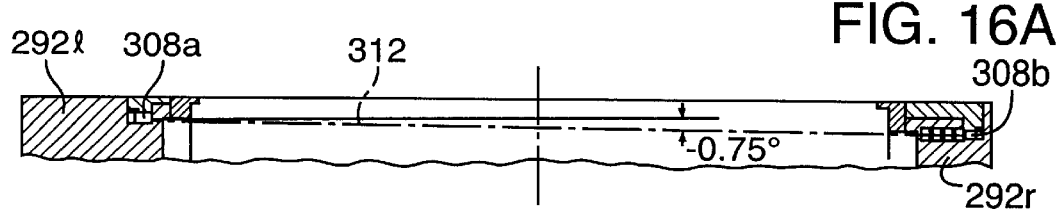
FIGS. 16A and 16B are diagrams showing the light beam paths of two sets of light emitters and light sensors.
Figure 16B:
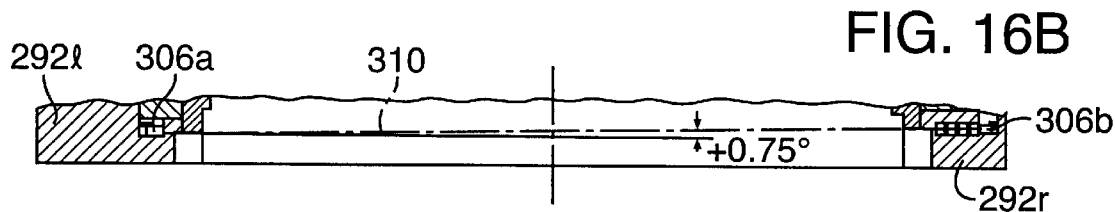
Figure 17:
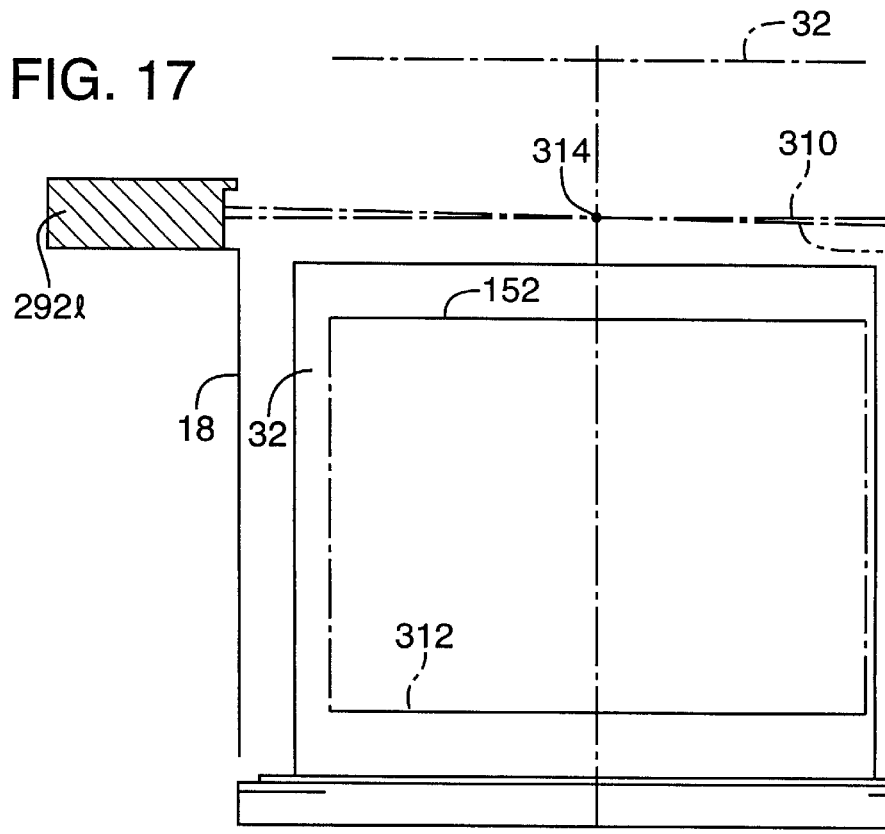
FIG. 17 is a diagram showing a front elevation view of the placement of a wafer cassette on a slidable tray (with the position of a properly registered semiconductor wafer shown in phantom) relative to the crossed beam paths of the light emitters and sensors shown in FIGS. 16A and 16B.

FIG. 16A shows in greatly enlarged detail a diagram of the placement of sensor 308*a* and emitter 308*b* in the respective scanning fingers 292*l* and 292*r*, and FIG. 16B shows in greatly enlarged detail a diagram of the placement of sensor 306*a* and emitter 306*b* in the respective scanning fingers 292*l* and 292*r*. With reference to FIGS. 16A and 16B, sensor 306*a* and emitter 306*b* are secured within the respective scanning fingers 292*l* and 292*r* in slightly upwardly beveled mounting surface areas that provide a straight line light beam path 310 inclined at a ±0.75° angle relative to the plane of the top surfaces of scanning fingers 292*l* and 292*r*. Sensor 308*a* and emitter 308*b* are secured within the respective scanning fingers 292*l* and 292*r* in slightly downwardly beveled mounting surface areas that provide a straight line light beam path 312 inclined at a −0.75° angle relative to the plane of the top surfaces of scanning fingers 292*l* and 292*r*. FIG. 17 is a diagram showing a front elevation view of the placement of wafer cassette 32 on slidable tray 24 relative to crossed light beam paths 310 and 312. Beam paths 310 and 312 are coplanar in a vertical plane and are angularly inclined in opposite directions to cross over at a point 314 at the midpoint of the distance between scanning fingers 292*l* and 292*r*. FIG. 17 also shows in phantom lines a semiconductor wafer 152 positioned above wafer cassette 32 and in a location representing proper registration of wafer 152 in wafer cassette 32.

The light beam paths are angularly inclined so that a single wafer 152 properly registered in a wafer cassette slot and in a specified elevator position interrupts both beams equally. As shown in FIG. 15 and described in greater detail below, scanning assembly 290 is supported on elevator assembly 28 that moves a port door carriage 344, the vertical position of which is measured by an optical position encoder 342. The movement of port door carriage 344 provides a continuous scan of the contents of wafer cassette 32. As elevator carriage travels past a next specified elevator position, sensors 306*a* and 308*a* produce output signals of equal magnitude for an elevator displacement equal to the wafer thickness. (The same wafer thickness is measured by the corresponding sensors and emitters for light beam paths 310 and 312 when wafer 152 is registered in its slot.) The magnitudes of the signals will change but the difference between the signals will not change as port door carriage 344 moves to the next specified elevator position.

A wafer 152 in cross slot position will interrupt only one beam for a specified elevator position and thereby cause sensors 306*a* and 308*a* to produce output signals of different magnitudes. The sensor output that indicates the presence of incident light represents the open slot and thus the direction of the horizontal tilt angle of wafer 32.

The common mode rejection properties of differential optical scanning assembly 290 reject signal perturbations caused by mechanical vibrations and provides for an accurate individual wafer thickness measurement. Two wafers 152 occupying the same slot will interrupt both light beams 310 and 312 for a specified elevator position; however, the magnitudes and difference between the signals will not change for a longer than nominal vertical displacement of port door carriage 344 as it moves to past next specified elevator position. The continuous signal interruption indicates a greater than nominal wafer thickness in a slot and thereby represents double wafer occupancy of a slot.

Figure 18:
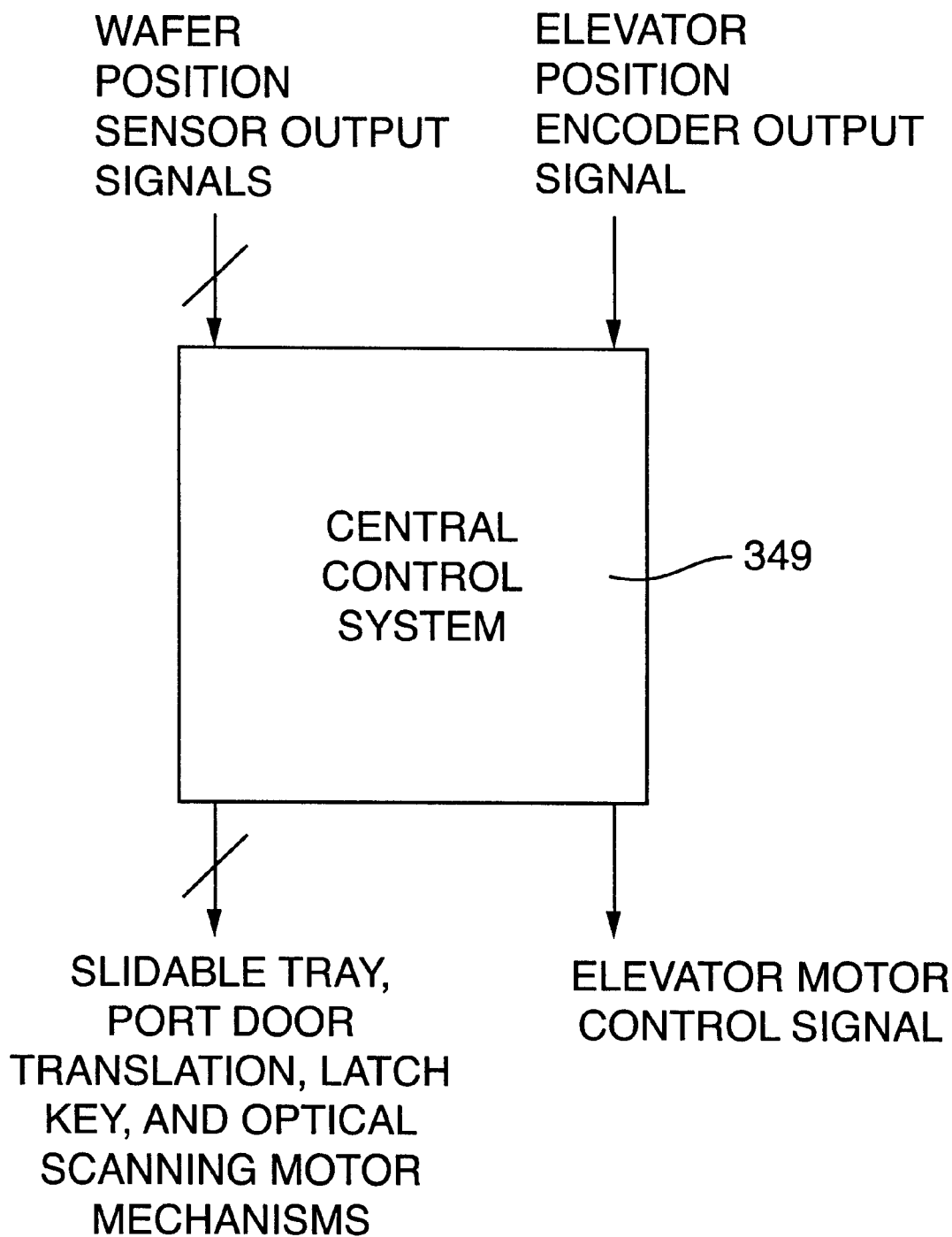
FIG. 18 is a simplified block diagram showing the input signals to and output signals from a central control system that coordinates the operations of the various components of the box load interface mechanism of the invention.
Figure 19:
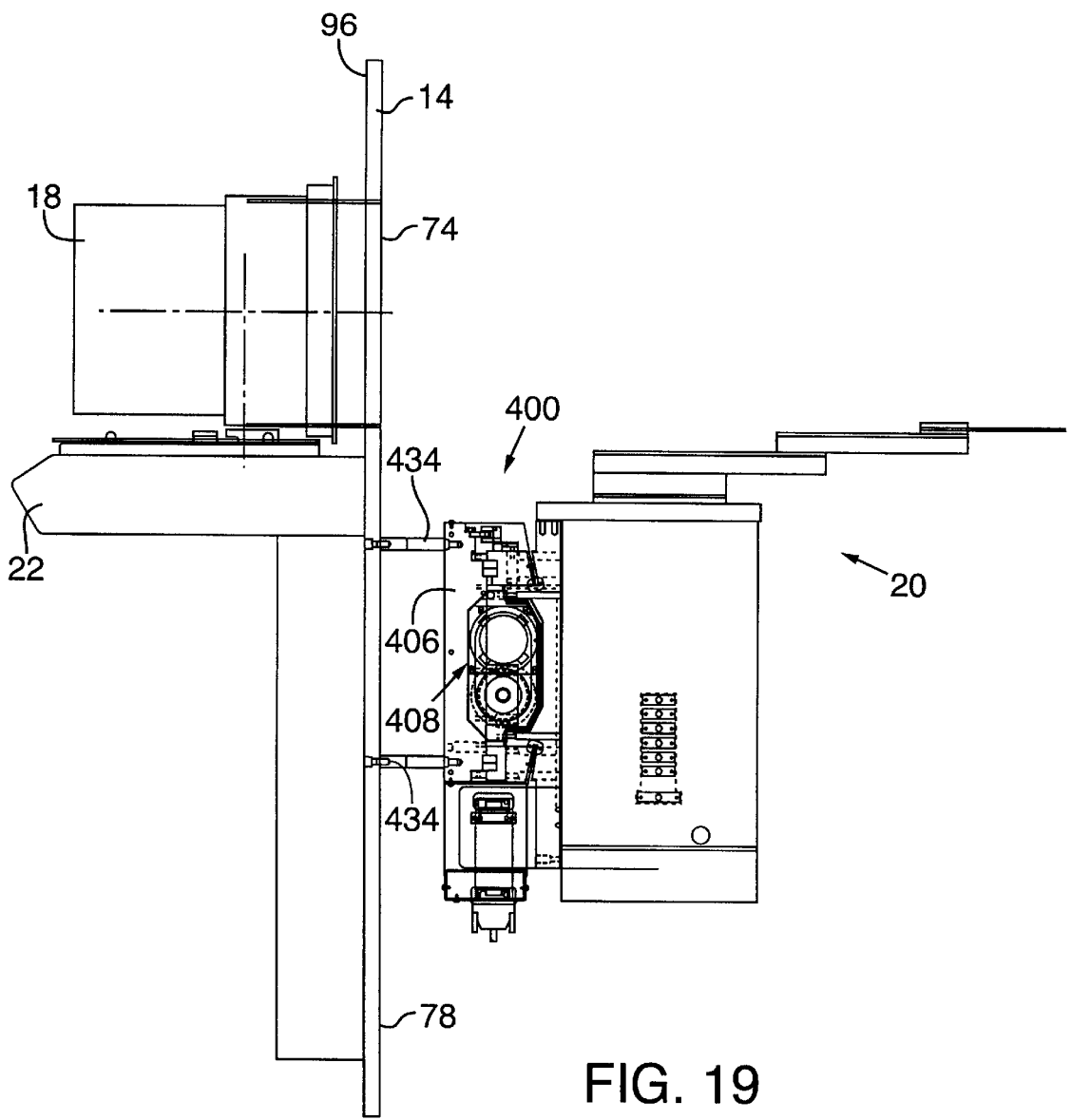
FIG. 19 is a side elevation view of a robot assembly mounted to a lead nut assembly.
Figure 20:
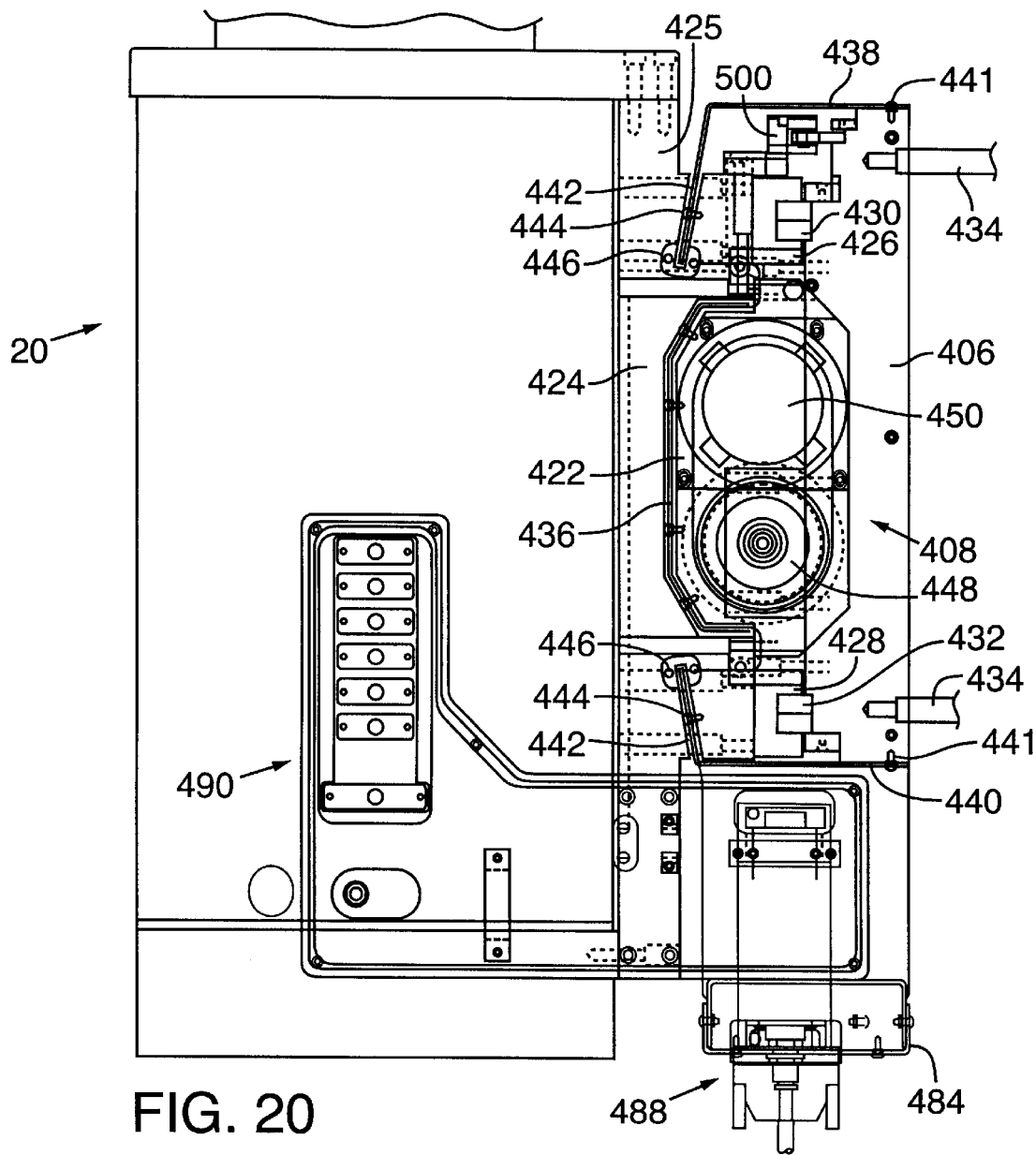
FIG. 20 is an partial side elevation view of the opposite end of the robot assembly.
Figure 21:
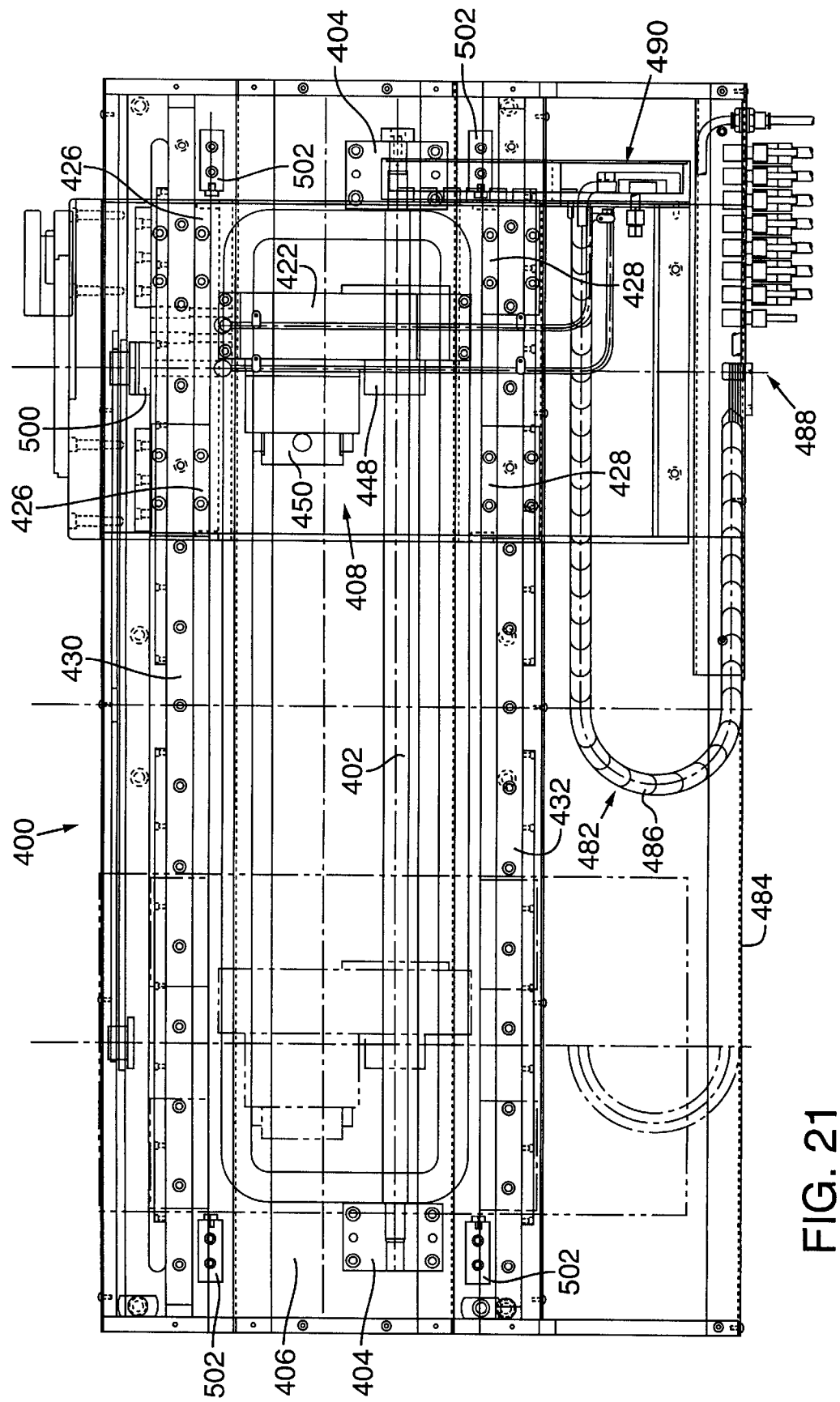
FIG. 21 is a plan view of the lead screw and lead nut assembly.
Figure 24:
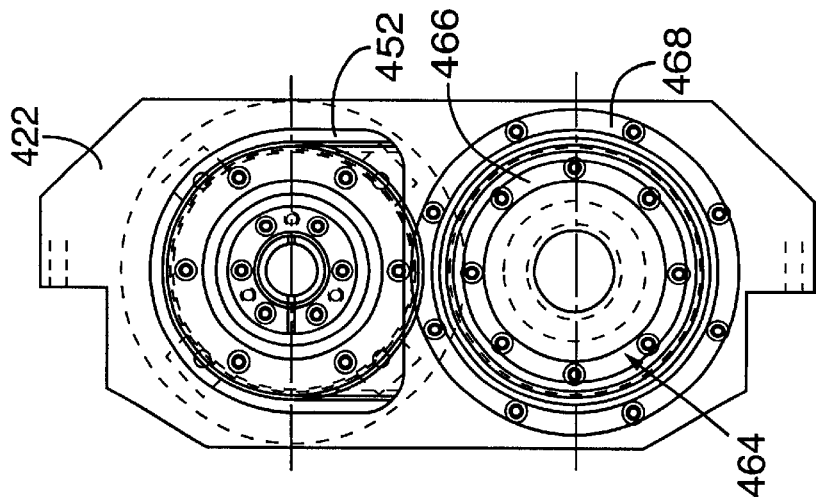
FIGS. 22–24 are respective left end view, plan view, and right end view of the lead nut assembly.
Figure 23:
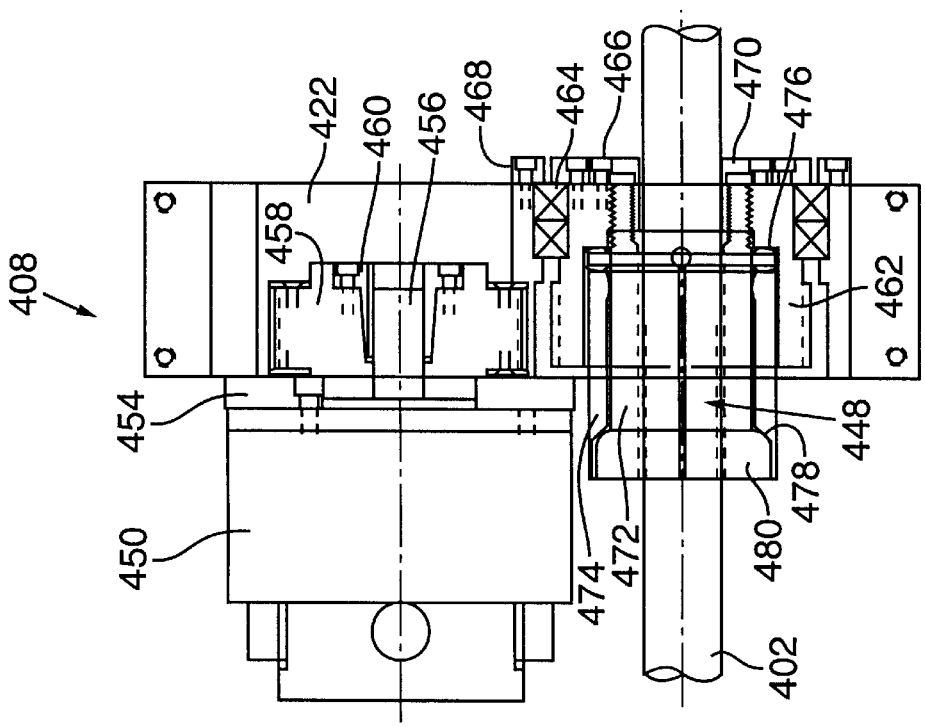
Figure 22:
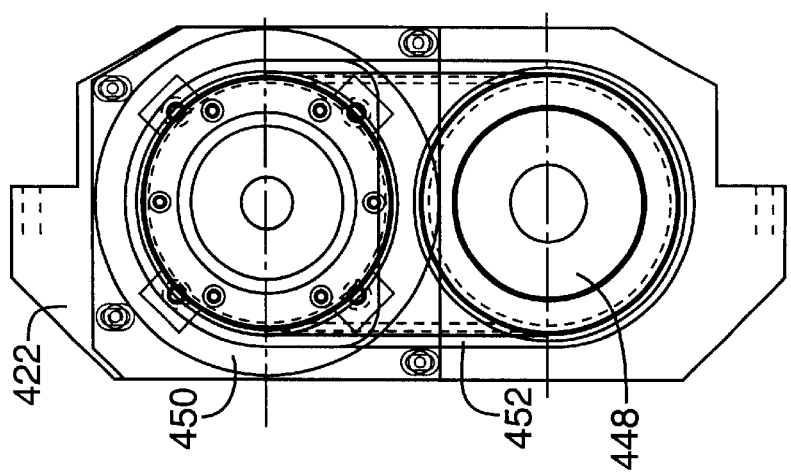

A light beam sensor 346*a* and emitter 346*b* form a light propagation path 348 in a transverse (preferably perpendicular) direction to that of coplanar light paths 310 and 312 described above. Sensor 346*a* and emitter 346*b* are positioned at the top and bottom sides of aperture 74 on interior surface 18 of front plate 14 and outside of the region where a wafer carrier box 18 would occupy to detect whether a wafer 152 has been dislodged to protrude from its slot in the front opening of carrier box 18. A dislodged wafer 152 descending out of carrier box 18 would interrupt light propagation path 348 to provide a signal that disables port door carriage 344 from descending farther and thereby prevent the protruding wafer 152 from being clipped by scanning fingers 292*l* and 292*r* as port door 76 is lowered. As indicated in FIG. 18, the output signals of sensors 306*a*, 308*a*, and 346*a* and of position encoder 342 are processed by a central control system 349 to make the above-described wafer registration determinations.

FIGS. 1, 8, 9, 12, and 15 show elevator assembly 28 supporting port door 76; FIG. 12 shows port door 76 in a fully raised position (solid lines) 350 and a fully lowered position (outlined in phantom lines) 352. Elevator assembly 28 comprises a side drive lead screw mechanism 354 that includes a lead screw 356 driven at a lower end by a smooth running, high torque, DC motor 358 and supported at an upper end by preloaded end bearings 360 for rotation about a longitudinal axis 362. Numerous servo motors are known in the art, are commercially available, and would be suitable. Motor 358 is in communication with and controlled by an input controller that generates input command voltage signals. The input controller forms a part of central control system 349, which directs the operation of the interface system of the present invention. Input command signals delivered to motor 358 are converted to rotation of a motor drive output shaft 364. Motor 358 provides bi-directional rotational output, reflecting the polarity of the voltage input signal. Motor drive output shaft 364 is operatively connected to lead screw 356. Rotation of motor drive output shaft 364 results in corresponding rotation of lead screw 356. A lead nut assembly 366 is threaded on lead screw 356 and operatively connected to port door carriage 344 connected to a side surface of port door 76 and lead screw 356. Rotation of lead screw 356 results therefore in linear displacement of lead nut assembly 366 along the length of lead screw 356. This results in linear displacement of port door carriage 344 to raise or lower port door 76 to perform a wafer scanning operation.

Optical position encoder 342 continuously monitors and provides feedback as to the position of lead nut assembly 366 and thereby the positions of wafers 152 stored in wafer cassette 32 relative to scanning fingers 292*l* and 292*r* mounted to port door 76. An encoder carriage 372 is mounted in fixed relation to and thus moves in concert with lead nut assembly 366. Encoder carriage 372 provides a housing for movable components of optical position encoder 342. Scanning assembly 290 is displaced as a consequence of the displacement of encoder carriage 372 caused by rotation of lead screw 356.

Port plate 76 and encoder carriage 372 are slidably mounted on stationary vertical support plates 374 by means of high precision, low friction linear bearing assemblies 378 arranged in parallel to longitudinal axis 362. Linear bearing assemblies 378 preferably extend for the full length of travel of lead nut assembly 366 and thereby positively guide encoder carriage 372 along the full length of its travel path. Various types of position encoders and devices for continuously monitoring and providing feedback relating to the displacement of lead nut assembly 366 and encoder carriage 372 are known in the art and would be suitable. Optical encoder assemblies are generally preferred, and encoders that operate using Moire fringe pattern principles to continuously monitor the position of encoder carriage 372 are especially preferred.

Optical position encoder 342 includes a read head mounting member 380 on which an array of light emitting diodes is mounted. A reference grating is rigidly mounted on read head mounting member 380, and a stationary grating 382 extends along the full length of travel of encoder carriage 372. The structural design and functions of read head mounting member 380 and stationary grating 382 that operate using Moire fringe pattern principles are known and described in commonly assigned U.S. Pat. No. 5,382,806.

The following summarizes the operational sequence of wafer transport system 10. An operator or robot mechanism places a carrier box 18 onto slidable tray 24, and all of the eleven sensors required by SEMI specifications check for proper registration of carrier box 18 on kinematic coupling pins 66. The operator or program control causes slidable tray 24 to move carrier box 18 relatively rapidly toward aperture 74 in front plate 14. A controller slows the motion of tray motor 100 to a constant speed when box door 30 reaches the penetration point of latch keys 150 relative to slots 46 in box 30. The controller is implemented with a force feedback system that by either sensing tray motor current or following a stored slidable tray position profile detects an obstruction or plastic component out-of-tolerance variation and prevents overpowering slidable tray 24 under conditions that would prevent proper engagement of box 30 with latch keys 150. The motor current sense entails sensing an amount of electrical current for a time relative to a distance traveled by slidable tray 24. The following of the tray position profile entails comparing to a stored position profile a present position derived from a rotary positioning encoder installed in tray motor 100. The force feedback system establishes for a valid zone of engagement a low force criterion applied to carrier box 18 that, when exceeded, causes tray motor 100 to stall and thereby allow for a reversal of travel direction of slidable tray 24 before penetration by latch keys 150 could be attempted.

When box door 30 mates with port door 76 and front side margin 148 forms a seal with the beveled side margin of aperture 74 in front plate 14, clamping finger 132 has completed securing carrier box 18 against slidable tray 24 and latch key motor mechanism 172 turns latch keys 150 to lock door 30 to port door 76. Port door translation mechanism 250 pulls box door 30 and port door 76 beyond interior surface 78 of front plate 14. Presence sensor 346*a* determines whether any of the wafers 152 is protruding from wafer cassette 32. A second presence sensor 347*a* positioned near finger pivot axes 298*l* and 298*r* of scanning fingers 292*l* and 292*r* sense excessive protrusion of a wafer 52 and prevents further downward motion by elevator assembly 28.

Elevator assembly 28 causes port door carriage 344 and thereby port door 76 to descend about 3 cm, and scanning fingers 292*l* and 292*r* flip out of port door 76 to their fully extended positions. Elevator assembly 28 then causes port door carriage 344 to descend to scan the contents of wafer cassette 32. If presence sensor 346*a* indicates at least one wafer 152 is protruding from wafer cassette 32, scanning fingers 292*l* and 292*r* retract at each wafer position and flip outwardly to push the protruding wafer 152 back into its slot in wafer cassette 32. Scanning fingers 292*l* and 292*r* repeat the flipping process for each wafer position until sensor 346*a* indicates an obstruction is no longer present.

Following completion of a scan, scanning fingers 292*l* and 292*r* retract, elevator assembly 28 moves port door carriage 344 to its lowermost position, and port door 76 remains parked as wafer processing by robot assembly 20 takes place. Upon completion of wafer processing, elevator assembly 28 returns port door 76 to its uppermost position to separate box door 30 from port door 76 and retract carrier box 18 away from front plate 14.

With reference to FIGS. 2 and 19–24, robot assembly 20 is positionable along a linear traveling robot assembly 400. Linear traveling assembly 400 includes a stationary lead screw 402 supported at either end by a pillow block 404 mounted to a stage base 406. Each pillow block 404 is bolted or otherwise secured to the stage base 406. A motor-driven rotating nut mechanism 408 is mounted to robot assembly 20 to move it along the lead screw 402 between apertures 74 of side-by-side front plates 14. The nut mechanism 408 is contained within a housing 422 that is secured to a carriage 424. The carriage 424 is connected to a robot mounting plate 425 that supports the robot assembly 20 so that the robot assembly 20 along with the carriage 424 moves along the lead screw 402 between the apertures 74. The carriage 424 includes upper and lower tracks 426 and 428 that travel along upper and lower rails 430 and 432 bolted or otherwise secured to the stage base 406. The stage base 406 is immovably secured to the front plates 14 by alignment fixtures 434 that are bolted or otherwise secured at each end. The housing 422 includes a sheet metal covering 436 to prevent dirt and dust from accumulating on the nut mechanism 408 and also serves as a safety cover to prevent injury that might result from clothing or anything that might get caught in the nut mechanism 408 as it travels along the lead screw 402. The nut mechanism 408 is further protected by sheet metal coverings 438 and 440 that are connected to the stage base 406 by screws 441 and that extend into slots 442 in the carriage 424 and secured by screws 444. The ends of the sheet metal coverings 438 and 440 cooperate with plastic glides 446 located within the carriage 424 to prevent the sheet metal coverings 438 and 440 from being bent and absorbs any misalignment and keeps them straight. The glides 446 also prevent metal to metal contact between the carriage 424 and the sheet metal coverings 438 and 440 which reduces contamination.

The nut mechanism 408 includes a lead nut 448 rotated by a motor 450 through a belt 452. The motor 450 is mounted to the housing 422 by a motor mount 454. The motor 450 includes a drive shaft 456 that rotates a motor pulley 458 connected thereto by a conical clamp 460. The belt 452 is in driving engagement with a lead nut pulley 462 to rotate the lead nut 448. The lead nut pulley 462 is rotated within a bearing 464 that is connected to the housing 422 through an inner race bearing clamp 466 and an outer race bearing clamp 468. The lead nut 448 is connected to the lead nut pulley 462 by screw threads at one end and is prevented from rotating within the lead nut pulley by a lock nut 470. The lead nut 448 has resilient fingers 472 at one end that are internally threaded and are forced inwardly by a lead nut sleeve 474 for engagement with the lead screw 402. Wave springs 476 located between the lead nut sleeve 474 and the lead nut pulley 462 urge the lead nut sleeve 474 toward the finger end of the lead nut 448. An internal cam surface 478 on the lead nut sleeve 448 acts on an enlarged end 480 of the resilient fingers 472 to force them inwardly into a secure threaded engagement with the lead screw 402.

The motor 450 receives power from an electrical cable 482 located beneath the carriage 424 and supported by a tray 484. The cable 482 is supported within an articulated track 486 with one end connected to a power source 488 and the opposite end connected to a power housing 490 on the carriage 424 so that the cable 482 can travel along with the carriage 424.

The robot assembly 400 is moved from one position to another by rotating the lead nut 448 in the above-described manner to advance the carriage 424 along the lead screw 402 until the final position is reached. A linear encoder scale 500 is connected to the carriage 424 and travels along with it indicate the position of the carriage 424. End stops 502 are connected to the stage base 406 at each end of the lead screw 402 to stop the carriage 424 at the proper location. Robot assembly 20 is positioned to retrieve and return wafers from wafer carrier boxes 18 mated against front plates 14 by box load interface systems 16.

To ensure precise alignment of robot assembly 20, front plate 14 includes for stage base 406 mounting holes 410 that constitute registration points for readily referencing robot assembly 20 to port plate 76 to ensure vertical and center-to-center alignment. This feature is advantageous because additional subsystems provided in system expansion would be automatically aligned to preassigned registration points.

It will be obvious to those having skill in the art that many changes may be made to the details of the above-described embodiment of this invention without departing from the underlying principles thereof. The scope of the present invention should, therefore, be determined only by the following claims.

What is claimed is:

1. In a front-opening interface mechanical standard (FIMS) system including a transport box comprising a front-opening box cover and a removable box door that opens and closes the front opening of the box, a box door latch mechanism operatively connected to a latch actuating coupler to releasibly secure the box door to the box cover in response to rotation of external latch keys inserted into the box to operate the latch actuating coupler, and a box bottom comprising a front clamping feature and a physical alignment interface having mating features that mate with kinematic coupling surfaces to which the transport box is intended to be mounted, a box load interface, comprising:

a retractable port door attachable to the box door to selectively move the box door toward or away from the box cover to thereby open or close it;

a port plate having a front surface and a port plate aperture through which the box door can move as the port door moves the box door toward or away from the box cover;

a slidable tray slidably mounted to a support shelf positioned transversely of the port plate, and a box hold down clamping mechanism mounted to the support shelf; and a slidable tray positioning mechanism for selectively moving the slidable tray on the support shelf and thereby move the transport box toward or away from the port plate, the positioning mechanism operatively connected to the clamping mechanism to engage the clamping mechanism to the front clamping feature and thereby apply an urging force to the box cover against the kinematic coupling surfaces while the slidable tray advances toward the port plate to push the front opening of the box cover against the front surface of the port plate, and to disengage the clamping mechanism from the front clamping feature and thereby release the urging force from the box cover against the kinematic coupling surfaces while the slidable tray retracts from the port plate to pull the box cover away from the front surface of the port plate.

2. The box load interface of claim 1, in which the port plate includes a surface from which two latch keys extend to mate with and operate the latch actuating coupler, and further comprising a latch key motor mechanism operatively connected to the latch keys to selectively rotate them between first and second angular positions to, respectively, secure the port door to and release the port door from the box door when the port and box doors are in matable connection.

3. The box load interface of claim 1, further comprising a port door translation mechanism operatively connected to the port door to move the port door toward the port plate aperture to a position to attach the port door to the box door and reverse direction to move the box door attached to the port door away from the box cover and through the port plate aperture.

4. The box load interface of claim 3, further comprising a port door elevator assembly that is operable in cooperation with the port door translation mechanism to move the port door in a direction generally parallel to the front surface of the port plate after the box door has been moved away from the box cover and through the port plate aperture.

5. The box load interface of claim 1, in which the box hold down clamping mechanism includes a pivot finger pivotally mounted to the support shelf and the slidable tray includes a push pin, the pivot finger having a recessed area that forms first and second angularly offset push pin contact surfaces that receive the push pin as the slidable tray moves the transport box, respectively, toward the port plate and thereby rotate the pivot finger in a first rotational sense to engage the pivot finger to the front clamping feature and away from the port plate and thereby rotate the pivot finger in a second rotational sense that is opposite to the first rotational sense to disengage the pivot finger from the front clamping feature.

6. The box load interface of claim 5 in which the pivot finger includes a roller bearing that engages the front clamping feature as the pivot finger rotates in the first rotational sense.

7. The box load interface of claim 1, in which the transport box holds a container in which multiple wafer specimens are stored in spaced-apart stacked arrangement, the container having an open front side where the wafer specimens are removed or inserted and parallel to which there is a facial datum plane that is defined as a vertical plane that bisects the wafer specimens, the box load interface further comprising a differential optical scanning assembly for detecting the positions of the wafer specimens, the scanning assembly including:

a first light emitter and a first light sensor spaced apart to produce a first straight line light beam path that is inclined at a first angle relative to a reference datum plane;

a second light emitter and a second light sensor spaced apart to produce a second straight line beam path that is inclined at a second angle relative to the reference datum plane, the first and second light sensors producing respective first and second output signals, and the first and second light beam paths inclined at respective first and second angles of known rotational sense;

a positioning mechanism for imparting controlled relative movement between the specimens stacked in the container and the first and second light sensors and the first and second light emitters, the relative movement taking place with the container occupying a space between the first and second light emitters and the first and second light sensors and along a plane transverse to the reference datum plane;

a position tracking device responsive to the relative movement to provide information from which positions of the specimens stored in the container can be derived; and a signal processor receiving and taking the difference of the first and second output signals produced by the respective and second light sensors as the specimens interrupt the first and second beam paths in response to the relative movement, the signal processor cooperating with the position tracking device to provide position and orientation information about the specimens stored in the container.

8. The box load interface of claim 7 in which a positioning device imparts movement to the container to cause the relative movement and the position tracking device provides information corresponding to positions of the container as it moves.

9. The box load interface of claim 1, further comprising a linear traveling mechanism connected to the port plate that supports a robot assembly for removing wafer specimens from and inserting wafer specimens into the transport box.

10. The box load interface of claim 9, in which the linear traveling mechanism includes a stationary lead screw that is mounted transverse to the port plate and that supports a carriage traveling along the lead screw through a lead nut assembly, the lead nut assembly including a lead nut drivingly engaged with the lead screw and rotationally driven by a motor mounted to the carriage.

11. The box load interface of claim 10, in which the lead nut is driven by the motor through a belt that is positioned over a motor pulley secured to a drive shaft of the motor and a lead nut pulley secured to the carriage.

12. The box load interface of claim 11, in which the lead nut is secured to the lead nut pulley through a lock nut to prevent relative rotation therebetween.

13. The box load interface of claim 11, in which the lead nut includes resilient fingers with internal threads for engaging threads on the lead screw.

14. The box load interface of claim 13, further comprising a lead nut sleeve biased toward the resilient fingers by a spring for urging the resilient fingers of the lead nut into engagement with the lead screw.

15. The box load interface of claim 14, in which the lead nut sleeve includes an inner cam surface that acts upon an enlarged end of the resilient fingers to urge them into threaded engagement with the lead screw.

16. The box load interface of claim 9, further comprising protective coverings for the lead nut assembly.

17. The box load interface of claim 16, further comprising glides located within the carriage that cooperate with the protective coverings to provide alignment and prevent contamination.

* * * * *